(12) United States Patent
Jang et al.

(10) Patent No.: US 7,009,202 B2
(45) Date of Patent: Mar. 7, 2006

(54) THIN FILM TRANSISTOR ARRAY PANEL HAVING A MEANS FOR VISUAL INSPECTION

(75) Inventors: Yong-Kyu Jang, Suwon (KR); Won-Kyu Lee, Sungnam (KR); Jin Jeon, Anyang (KR)

(73) Assignee: Samsung Electronics Co., Ltd., (JP)

( * ) Notice: Subject to any disclaimer, the term of this patent is extended or adjusted under 35 U.S.C. 154(b) by 0 days.

(21) Appl. No.: 10/843,270

(22) Filed: May 11, 2004

(65) Prior Publication Data

US 2004/0207018 A1 Oct. 21, 2004

Related U.S. Application Data

(62) Division of application No. 10/161,236, filed on Jun. 3, 2002, now Pat. No. 6,774,398.

(30) Foreign Application Priority Data

Oct. 11, 2001 (KR) ............... 2001-62619
Dec. 19, 2001 (KR) ............... 2001-81049

(51) Int. Cl.
*H01L 29/04* (2006.01)
(52) U.S. Cl. ............... 257/59; 257/48; 257/72
(58) Field of Classification Search ............... 257/48, 257/59, 72, 347; 349/42, 54
See application file for complete search history.

(56) References Cited

U.S. PATENT DOCUMENTS 6,618,100 B1 * 9/2003 Oike et al. ............... 349/42
6,624,857 B1 * 9/2003 Nagata et al. ............... 349/54

* cited by examiner

*Primary Examiner*—Tuan H. Nguyen
(74) *Attorney, Agent, or Firm*—Cantor Colburn LLP

(57) ABSTRACT

A plurality of gate lines and a plurality of data lines intersecting the gate lines to define a display area are formed on an insulating substrate including a display area and a surrounding area. On the surrounding area, a gate driving circuit connected to the gate lines and a logic circuit for VI interposed between the gate driving circuit and the gate line and having several first to third NOR gates are formed. A first input terminal of the first NOR gate of the logic circuit for VI is connected to an output terminal of the gate driving circuit, and a second input terminal thereof is connected to a CON1 terminal, and an output terminal thereof is connected to a first input terminal of the second or the third NOR gate. A second input terminal of the second NOR gate is connected to a CON2 terminal and an output terminal thereof is connected to the gate lines in odd number. A second input terminal of the NOR gate is connected to a CON3 terminal and an output terminal thereof is connected to the gate lines in even number.

9 Claims, 25 Drawing Sheets

THIN FILM TRANSISTOR ARRAY PANEL HAVING A MEANS FOR VISUAL INSPECTION

CROSS REFERENCE TO RELATED APPLICATIONS

This application is a divisional application of U.S. patent application Ser. No. 10/161,236, filed on Jun. 3, 2002 now U.S. Pat. No. 6,774,398, the disclosure of which is herein incorporated by reference in its entirety.

BACKGROUND OF THE INVENTION (a) Field of the Invention

The present invention relates to a thin film transistor array panel, in particular to a visual inspection means and a method of performing visual inspection in a thin film transistor array panel having a gate driving circuit integrated therein.

(b) Description of the Related Art

A thin film transistor array panel is used as a circuit panel for driving each of pixels independently in a liquid crystal display (LCD) or an organic electroluminescence (EL) display, etc. In the thin film transistor panel, a scan signal wire or a gate wire for transferring a scan signal and an image signal wire or a data wire for transferring an image signal are formed. Also, a thin film transistor connected to the gate wire and the data wire, a pixel electrode connected to the thin film transistor, a gate insulating layer for covering and insulating the gate wire and a passivation layer for covering and for insulating the thin film transistor and the data wire are formed therein. The thin film transistor comprises a semiconductor layer fanning a channel together with a gate electrode that is a part of the gate wire, a source electrode and a drain electrode that is a part of the data wire, the gate insulating layer and the passivation layer. The thin film transistor is a switching element that transmits the image signal transmitted through the data wire to the pixel electrode depending on the scan signal transmitted through the gate wire.

An LCD is a representative of display devices using such a thin film transistor panel, and especially a middle-small type LCD, such as a reflection type or semi-transmittance type mostly, employs a COG (chip on glass) type. In this case, visual inspection (VI) or gross test (GT) is done before a COG IC mounting process so as to save expensive COG ICs, polarizers and a compensating film and to increase the yield. It is difficult to apply GT to a practical process since the test requires an expensive equipment and furthermore a long processing time. In addition, a currently available VI is performed after forming a wire for inspection to connect gate lines and data lines between the COG terminals or to its opposite side to perform the VI, then a diamond-cutting is done together with a panel or a laser-cutting is done to divide the wire for inspection. In this case, in such a cutting process, pollutant particles are generated or the wire is corroded through a cut side thereof, and thereby degrading the reliability.

In the meanwhile, TFT panels can be manufactured by a method in which a driving integrated circuit is directly formed on the thin film transistor, either partially or as a whole. As such example, there are a poly silicon thin film transistor panel (Poly TFT Panel) and an amorphous driving integrated circuit panel (a-si IC Panel). In the method of directly forming the driving IC on the TFT panel as a whole, GT can be performed by the TFT itself. However, the method of directly forming only a portion of the driving IC on the TFT panel needs an expensive equipment to perform GT.

Furthermore, it is hard to employ a laser-cutting after inspection since the driving IC formed on the TFT works as impediments on laser-cutting and, due to forming the TFT panel and a color filter panel in a same size, a space for laser-cutting is not easy to obtain.

SUMMARY OF THE INVENTION

The present invention increases the reliability of a liquid crystal display by solving the problems.

The present invention provides a means for performing a visual inspection in a thin film transistor having a driving integrated circuit.

The present invention also provides methods for performing visual inspection in a thin film transistor having a driving integrated circuit.

In one aspect, the present invention provides a thin film transistor panel comprising a logic circuit for VI connected between a gate driving circuit and a gate line to apply a gate inspection signal.

In detail, a thin film transistor panel includes an insulating substrate having a display area and a surrounding area, a first signal line formed on the insulating substrate, a second signal line formed on the insulating substrate and insulated with and intersecting the first signal line to define the display area, a plurality of driving signal lines formed on the surrounding area of the insulating substrate and connected to a $V_{off}$ voltage applying terminal, a plurality of inspection signal lines formed on the surrounding area of the insulating substrate, a first thin film transistor for inspection having a drain electrode coupled to the first signal line, a source electrode coupled to any one of the inspection signal lines and a gate electrode coupled to any one of the driving signal lines, and a second thin film transistor for inspection having a drain electrode coupled to the second signal line, a source electrode coupled to any one of the inspection signal lines and a gate electrode coupled to any one of the driving signal lines.

The inspection signal line connected to the second thin film transistor for inspection comprises a first inspection signal line and a second inspection signal line. The second thin film transistor for inspection may be alternatingly connected to the first inspection signal line and the second inspection signal line. The first inspection signal line connected to the first thin film transistor for inspection comprise third and fourth inspection signal lines. The first thin film transistor for inspection may be alternatingly connected to the third inspection signal line and the fourth inspection signal line.

In addition, the inspection signal line connected to the second thin film transistor for inspection comprises first, second and third inspection signal lines. The second thin film transistor for inspection may be connected to the first, second and third inspection signal lines in turn. The inspection signal line connected to the first thin film transistor for inspection comprises fourth and fifth inspection signal lines. The first thin film transistor for inspection is alternatingly connected to the fourth and fifth inspection signal lines.

The driving signal line connected to the second thin film transistor for inspection comprises first, second and third driving signal lines. The second thin film transistor for inspection may be connected to the first, second and third driving signal lines in turn.

A detailed structure of a thin film transistor panel having a thin film transistor for inspection is as below.

The thin film transistor panel includes an insulating substrate having a display area and a surrounding area, a gate line formed on the insulating substrate, a data driving signal line formed on the surrounding area of the insulating substrate, a data inspection signal line formed on the surrounding area of the insulating area, a gate insulating layer formed on the gate lines, the data driving signal lines and the data inspection signal lines, a semiconductor pattern formed on the gate insulating layer, at least a portion thereof overlapping the data driving signal lines, first and second ohmic contact layers formed on the first semiconductor pattern and exposing therebetween a portion of the first semiconductor pattern corresponding to the data driving signal lines, a data line formed on the gate insulating layer and intersecting the gate lines to define the display area, at least a portion thereof being formed on the second ohmic contact layer, a first electrode for inspection formed on the gate insulating layer, at least a portion thereof being formed on the first ohmic contact layer, a passivation layer formed on the data lines and the first electrode for inspection, and a first connection portion formed on the passivation layer and connecting the data inspection signal lines and the first electrode for inspection.

The thin film transistor panel may further include a gate driving signal line formed on the surrounding area of the insulating substrate, a gate inspection signal line formed on the surrounding area of the insulating substrate, a second semiconductor pattern formed on the gate insulating layer, at least a portion thereof overlapping the gate driving signal line, third and fourth ohmic contact layers formed on the second semiconductor pattern and exposing therebetween a portion of the second semiconductor pattern corresponding to the gate driving signal line, a second electrode for inspection formed on the gate insulating layer, at least a portion thereof being formed on the third ohmic contact layer, a third electrode for inspection formed on the gate insulating layer, at least a portion thereof being formed on the fourth ohmic contact layer, a second connection portion formed on the passivation layer and connecting the gate line and the third electrode for inspection, and a third connection portion formed on the passivation layer and connecting the gate inspection signal line and the second electrode for inspection. The first to fourth ohmic contact layers are formed on an entire surface of the data line and the first to the third electrodes for inspection, respectively.

The thin film transistor panel may further include a transmission gate circuit formed on the surrounding area, an output terminal thereof being connected to the data lines, and a short strip connected to an input terminal of the transmission gate circuit, or further include a transmission gate circuit formed on the surrounding area of the insulating substrate and having an output connected to the data lines, a driving signal line formed on the surrounding area of the insulating substrate and connected to $V_{off}$ voltage applying terminal, an inspection signal line formed on the surrounding area of the insulating substrate, and a thin film transistor for inspection having a drain electrode coupled to the data lines, a source electrode coupled to the inspection signal line and a gate electrode coupled to the driving signal line. In addition, the inspection signal line connected to the thin film transistor for inspection comprises first and second inspection signal lines, and it is preferable that the thin film transistor for inspection is connected to the first inspection signal and the second inspection signal in turn.

In the meantime, the thin film transistor panel further includes a first short strip connected to the data lines in odd number and a second short strip connected the data lines in even number.

Even though not forming such a logic circuit, in a liquid crystal display including a first insulating substrate having a display area and a surrounding area, a plurality of gate lines formed on the first insulating substrate, a plurality of data lines formed on the first insulating substrate and intersecting the gate lines to define the display area, a pixel thin film transistor formed on the first insulating substrate and connected to the gate lines and the data lines, a pixel electrode formed on the display area and connected to the pixel thin film transistor, a gate driving circuit formed on the surrounding area of the thin film transistor and connected to the gate lines and having first and second clock signal terminals, an on and off power terminal and a scan start terminal, a driving signal line formed on the surrounding area of the first insulating substrate and a driving signal terminal, an inspection signal line on the surrounding area of the first insulating substrate and an inspection signal terminal, a thin film transistor for inspection having a drain electrode coupled to the data lines, a source electrode coupled to the inspection signal line and a gate electrode coupled to the driving signal line, a common voltage terminal formed on the surrounding area of the first insulating area, a second insulating substrate disposed opposite the first insulating substrate, a common electrode formed on the second insulating substrate and connected to the common voltage terminal, and a liquid crystal material injected between the first and the second insulating substrates, visual inspection is performed by applying Von voltages to the first and second clock signal terminals of the gate driving circuit, the on and off power terminal, the scan start terminal and the driving signal terminal, and by applying a common voltage to the common voltage terminal.

Alternatively, in a liquid crystal display including a first insulating substrate consisting of a display area and a surrounding area, a plurality of gate lines formed on the first insulating substrate, a plurality of data lines formed on the first insulating substrate and intersecting the gate lines to define the display area, a pixel thin film transistor formed on the first insulating substrate and connected to the gate lines and the data lines, a pixel electrode formed on the display area and connected to the pixel thin film transistor, a gate driving circuit formed on the surrounding area of the thin film transistor and connected to the gate lines and having first and second clock signal terminals, an on and off power terminal and a scan start terminal, a short strip formed on the surrounding area of the first insulating area and connected to the data lines, a common voltage terminal formed on the surrounding area of the first insulating area, a second insulating substrate disposed opposite the first insulating substrate, a common electrode formed on the second insulating substrate and connected to the common voltage terminal, and a liquid crystal material injected between the first and second insulating substrates, it is possible to perform visual inspection by applying Von voltages to the first and second clock signal terminals of the gate driving circuit, the on and off power terminal, the scan start terminal and the driving signal terminal, and applying an inspection signal to the short strip and applying a common voltage to the common voltage terminal.

BRIEF DESCRIPTION OF THE DRAWINGS

FIGS. 4A and 4B to FIGS. 9A and 9B are cross sectional views to show each of steps for manufacturing a thin film transistor according to the first embodiment of the present invention, and "A" represents a portion corresponding to FIGS. 3A and "B" represents a portion corresponding to FIG. 3B.

DETAILED DESCRIPTION OF THE INVENTION

A thin film transistor (TFT) will be described in detail referring to accompanying drawings.

Figure 1:
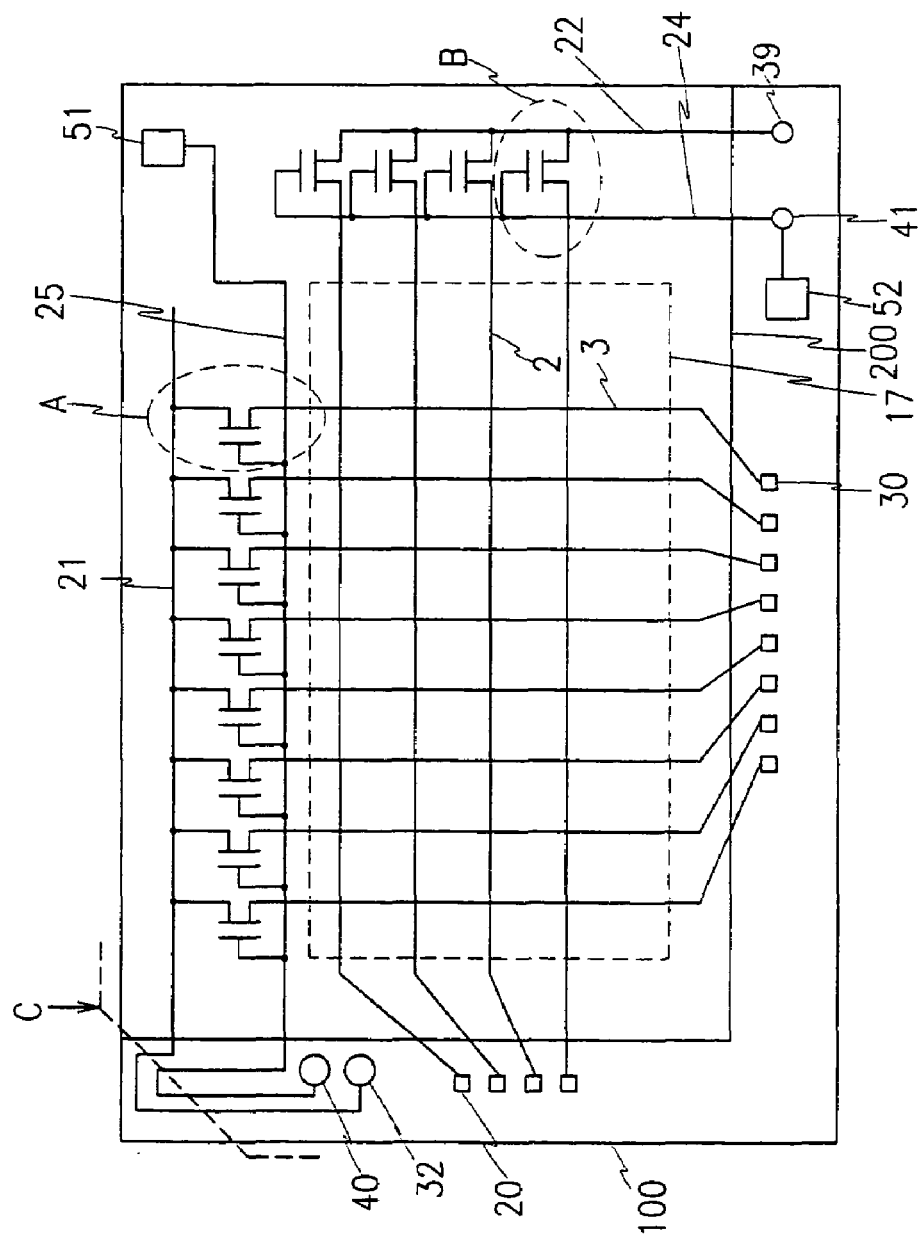
FIG. 1 is a circuitry diagram of a thin film transistor according to first and second embodiments of the present invention.

FIG. 1 is a circuitry diagram according to first and second embodiments of the present invention.

A plurality of gate lines 2 extend in a transverse direction and a plurality of data lines 3 insulated to intersect the gate lines 2 in a longitudinal direction are formed on an insulating substrate 100. A plurality of gate pads 20 connected to gate driving ICs are connected to a first end of the gate lines 2, and a plurality of data pads 30 connected to date driving ICs are connected to a second end of the data lines 3. The gate lines 2 and the data lines 3 intersect each other to define a pixel area, a group of the pixel areas form a display area. A portion other than the display area is defined as a surrounding area. A gate TFT B for inspection is connected to a third end opposite the first end of the gate line 2, and a data TFT A for inspection is connected to a fourth end opposite the second end of the data line 3. The gate TFT B is also connected to a gate inspection signal line 22 and a gate driving signal line 24, and the data TFT A is also connected to a data inspection signal line 21 and a gate driving signal line 25. The gate line 2, the gate inspection signal line 22 and the gate driving signal line 24 are connected with a drain electrode, a source electrode and a gate electrode of the gate TFT B, respectively. In addition, the data line 3, the data inspection signal line 21 and the driving signal line 25 are connected with a drain electrode, a source electrode and a gate electrode of the data TFT A, respectively. A first pad to a fourth pad 39, 41, 32 and 40 are connected to respective ends of the gate inspection signal line 22, the gate driving signal line 24, the data inspection signal line 21 and the data driving signal line 25. The gate driving signal line 24 is connected to a gate $V_{off}$ terminal 52 through the second pad 41 and the data driving signal line 25 is connected to a data $V_{off}$ terminal 51. That is, all the gate electrodes of the gate TFTs B are connected to the gate $V_{off}$ terminal 52, and all the gate electrodes of the data TFTs A are connected to the data $V_{off}$ terminal 51. The $V_{off}$ terminals 51 and 52 are kept constant as $V_{off}$ voltages by being connected with $V_{off}$ voltage source via an FPC (flexible printed circuit) in a later process. Thus, TFTs A and B are always in an off state which is the same as a disconnection state. Accordingly, a diamond-cutting or a laser-cutting does not need to be performed in order to divide a wire for inspection with a data line and a gate line. The data inspection signal line 21 and the data driving signal line 25 are connected to the third and fourth pads 32 and 40, respectively, in the same way as the gate inspection signal line 22 and the gate driving signal line 24 are connected to the first and second pads 39 and 41, respectively. Alternatively, the data inspection signal line 21 and the data driving signal line 25 can be extracted out of an edge portion of the substrate 100 to be bent. This is for the purpose of simultaneously cutting the data inspection signal line 21 and the data driving signal line 25 and polishing the edge along a cut line (C).

The substrate 200 that includes a common electrode, a black matrix and color filters is facing with the substrate 100.

Such a structure of the TFT panel will be described in detail with reference to the drawings.

Figure 2A:
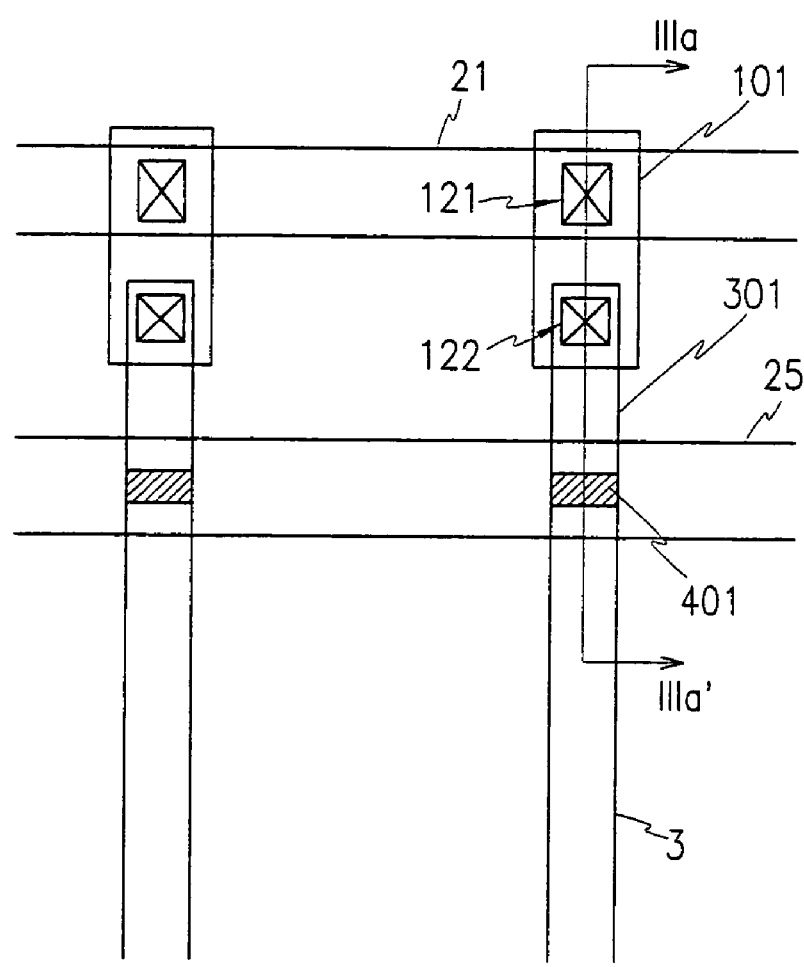
FIGS. 2A and 2B are layouts of a thin film transistor according to the first embodiment of the present invention, each of which is a layout of A and B shown in FIG. 1.
Figure 2B:
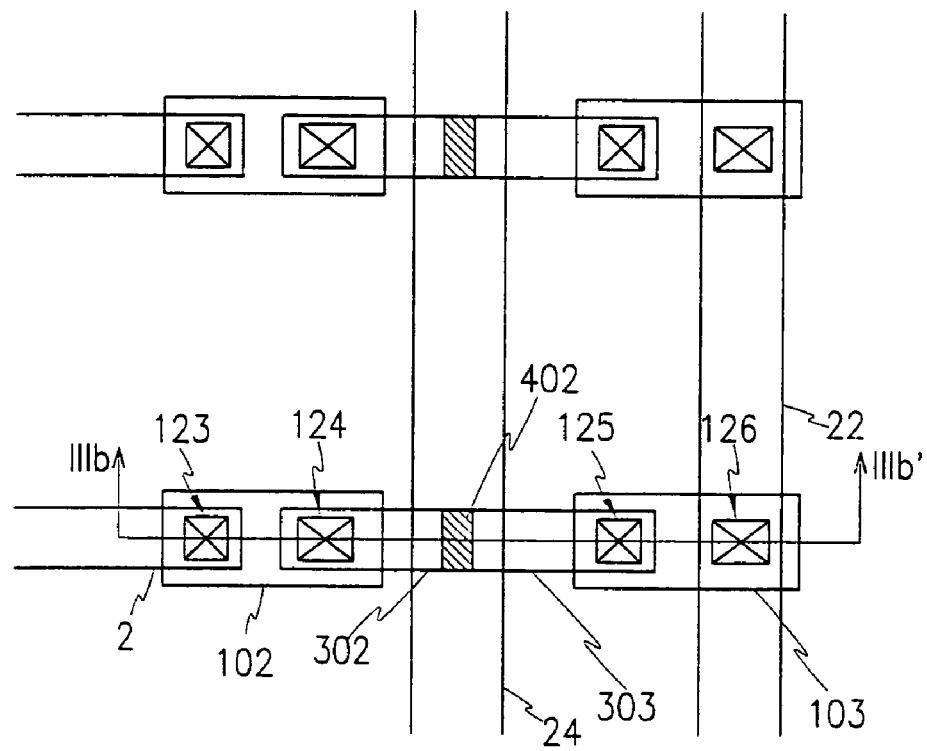
Figure 3A:
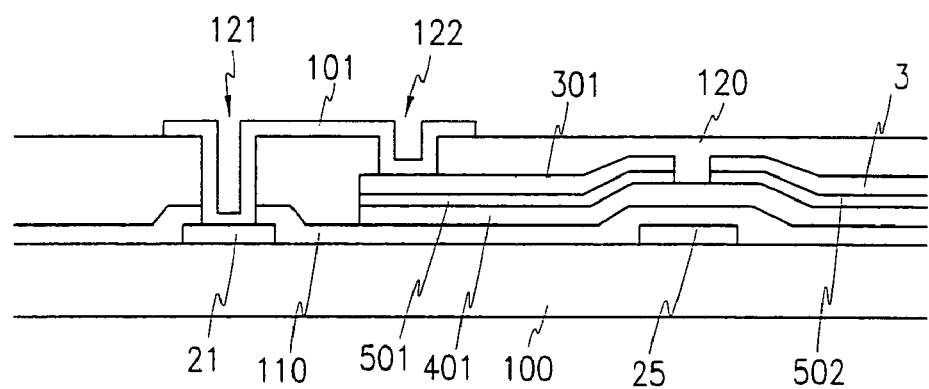
FIGS. 3A and 3B are cross sectional views taken along line IIIa–IIIa' of FIG. 2A and line IIIb–IIIb' of FIG. 2B, respectively.
Figure 3B:
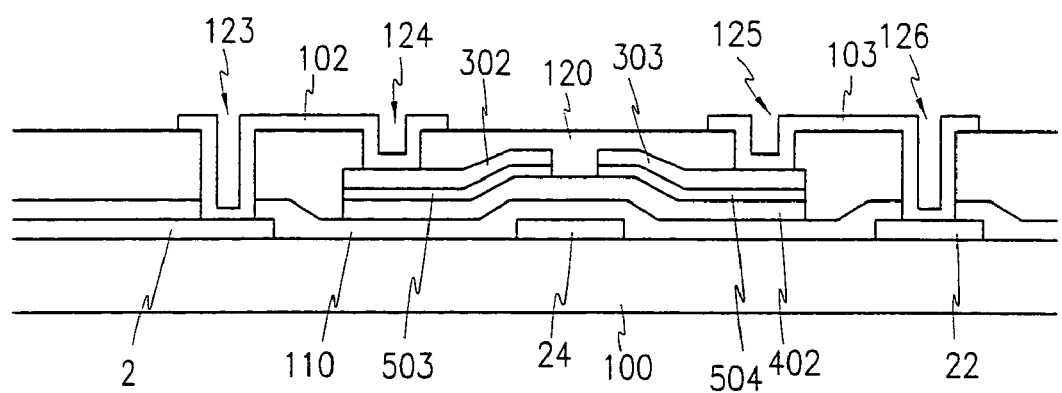

FIGS. 2A and 2B are layouts of the TFT according to the first embodiment of the present invention, each of which is a layout of the TFT A and the TFT B, and FIGS. 3A and 3B are cross sectional views taken along line IIIa–IIIa' of FIG. 2A and line IIIb–IIIb' of FIG. 2B.

First, a data TFT A for inspection will be described with reference to FIGS. 2A and 3A.

The data inspection signal line 21 and the data driving signal line 25 are formed extending in a transverse direction on the insulating substrate 100, and a gate insulating layer 110 is formed thereon. A first semiconductor pattern 401 extends in a longitudinal direction on the gate insulating layer 110. The first semiconductor pattern 401 intersects the data driving signal line 25 but does not reach the data inspection signal line 21. On the first semiconductor pattern 401, ohmic contact layers 501 and 502 are formed. The ohmic contact layers 501 and 502 expose therebetween a portion of the first semiconductor pattern 401 corresponding to the data driving signal line 25. The data line 3 and a source electrode 301 for data are formed on an entire surface of the ohmic contact layers 501 and 502. A passivation layer 120 is formed on the data line 3 and the source electrode 301, and has a first contact hole 121 for exposing the data inspection signal line 21 and a second contact hole 122 for exposing the source electrode 301. A first connecting portion 101 for connecting the data inspection signal line 21 with the source electrode 301 is formed on the passivation layer 120.

Next, a gate TFT B for inspection will be described with reference to FIGS. 2B and 3B.

The gate inspection signal line 22 and the gate driving signal line 24 are formed extending in a longitudinal direction on the insulating substrate 100, and the gate line 2 extends in a transverse direction. The gate insulating layer 110 is formed thereon. A second semiconductor pattern 402 extends in a transverse direction on the gate insulating layer 110. The second semiconductor pattern 402 intersects the gate driving signal line 24 but does not reach the gate inspection signal line 22. On the second semiconductor pattern 402, ohmic contact layers 503 and 504 are formed. The ohmic contact layers 503 and 504 expose therebetween a portion of the second semiconductor pattern 402 corresponding to the gate driving signal line 24. A drain electrode 302 for gate and a source electrode 303 for gate are formed on an entire surface of the ohmic contact layers 503 and 504. The passivation layer 120 is formed on the drain electrode 302 and the source electrode 303, and has a third contact hole 123 for exposing the gate line 2, a fourth contact hole 124 for exposing the drain electrode 302, a fifth contact hole 125 for exposing the source electrode 303 and a sixth contact hole 126 for exposing the gate inspection signal line 22. A second connecting portion 102 for connecting the gate line 2 with the drain electrode 302 and a third connecting portion 103 for connecting the source electrode 303 with the gate inspection signal line 22 are formed on the passivation layer 120.

FIGS. 4A and 4B to FIGS. 9A and 9B are cross sectional views to show each of steps for manufacturing a thin film transistor according to the first embodiment of the present invention, and "A" represents a portion corresponding to FIG. 3A and "B" represents a portion corresponding to FIG. 3B.

Figure 4A:
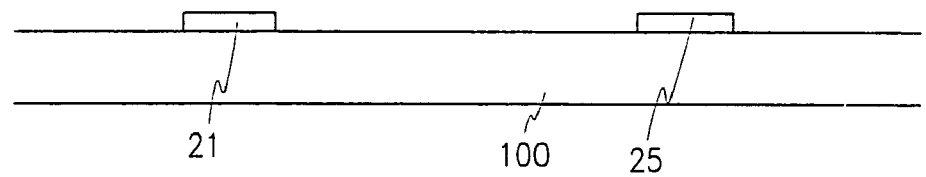
Figure 4B:
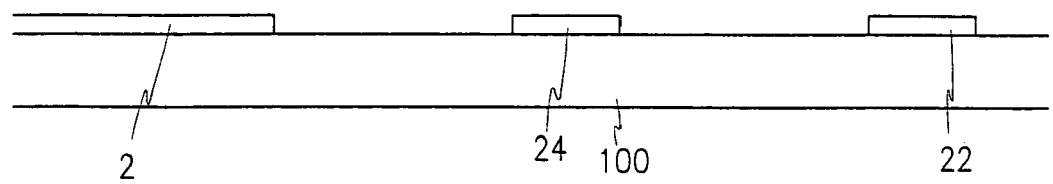

First, as shown in FIG. 4A and FIG. 4B, on the insulating layer 100, a gate metal layer is deposited and photo-etched to form the gate line 2, the gate inspection signal line 22, the gate driving signal line 24, the data inspection signal line 21 and the data driving signal line 25, which can be formed as double layers. For example, Cr or Mo alloy layer having desirablephysicochemical characteristics is deposited to form a first layer, and then, Al or Ag alloy having a small resistance is deposited to form a second layer on the first layer.

Figure 5A:
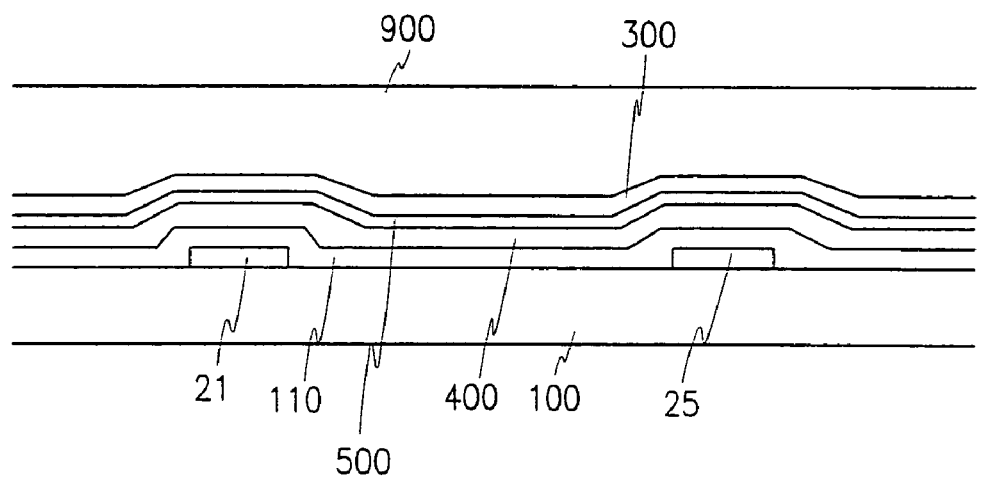
Figure 5B:
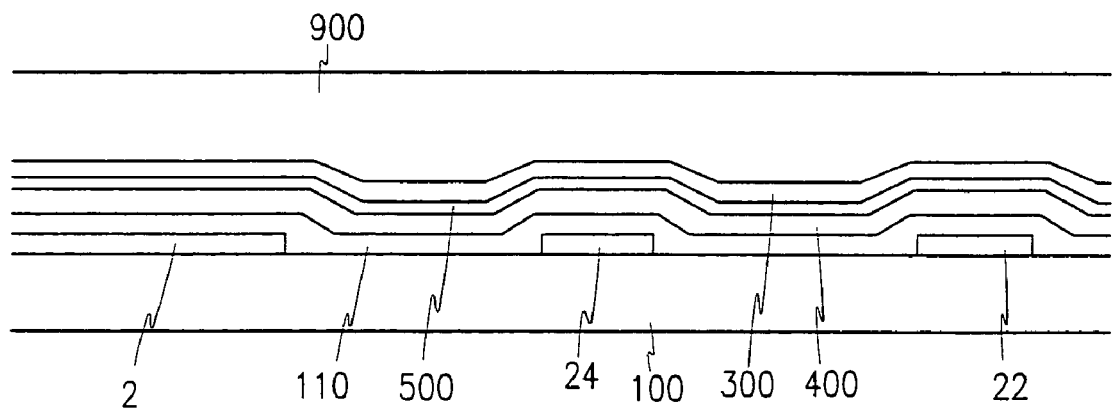

Next, as shown in FIGS. 5A and 5B, the gate insulating layer 110 made of SiNx, a semiconductor layer 400 and an ohmic contact layer 500 are deposited 1,500–5,000 Å thick, 500–2,000 Å thick and 300–600 Å thick in succession by a chemical vapor deposition, and then, a data metal layer 300 is deposited, and then, a photosensitive film is coated 1–2 μm thick thereon. The data metal layer may be formed as double layers. For example, Cr or Mo alloy layer having desirable physicochemical characteristics is deposited to form a first layer, and then, Al or Ag alloy having a small resistance is deposited to form a second layer on the first layer. The metal layers can be deposited by, for example, a sputtering method. Moreover, the gate insulating layer 110 is made of SiNx, the semiconductor layer 400 is made of an amorphous silicon and the ohmic contact layer is made of an amorphous silicon that the N type impurity such as P is doped with a high concentration.

Next, photosensitive film patterns 911 and 912 are formed by irradiating a light into a photosensitive film 900 through masks and developing it. The photosensitive film 900 is removed to remain a first portion 912 and a second portion 911, and the first portion 912 is made to be thinner than the second portion 911. The first portion 912 is located between a source electrode (not shown) and a drain electrode (not shown) of a display area, between the data line 3 and the source electrode 301 and between the drain electrode 302 and the source electrode 303, and the second portion 911 is located on a portion where the data layer patterns 3, 301, 302 and 303 including the source and drain electrodes of the display area, the data line 3 and the source electrode 301, the drain electrode 302 and the source electrode 303 will be formed. In this case, the ratio of thickness of the first portion 912 left in the channel portion C and thickness of the second portion 911 left in the data layer pattern portion A varies depending on an etching condition described later. For example, the thickness of the first portion 912 is less than a half, for example, less than 4,000 Å, of that of the second portion 911.

As described above, there may be several methods for varying the thickness of the photosensitive film depending on positions, and the pattern of a slit type or a lattice type is formed on the mask, or, a semi-transmittance area is formed thereon by using a semi-transparent film, in order to adjust an amount of a light transmittance in the area A.

In this regard, it is preferable that a line width of the patterns or an interval of the pattern placed among the slits, that is, the width of the slit is smaller than a resolution used at exposure in case of using a semi-transparent film, and thin films with different transmittances or different thickness may be used to adjust the transmittance on manufacturing masks.

When a light is irradiated to the photosensitive film through such masks, polymeric molecules in a portion exposed directly to the light are completely decomposed, and polymeric molecules in a portion where the slit pattern or the semi-transparent film is formed are not completely decomposed because an amount of a light irradiation is reduced, and polymeric molecules in a portion blocked by a light-shield film is hardly decomposed. Next, when the photosensitive film is developed, only the portion where the polymeric molecules are not decomposed is left, and the portion where the light is irradiated a little is left thinner than that in the portion where the light is not irradiated at all. To obtain this effect, an exposure time should be properly adjusted.

Such a thin photosensitive film is formed using a photosensitive film made of a material capable of reflowing. That is, it is exposed with a normal mask having a portion which transmits a light completely and a portion which does not transmit a light completely, and then, developed and reflowed to get a portion of the photosensitive film to flow to the portion where the photosensitive film does not remain, and consequently, the thin photosensitive film is formed.

Next, the photosensitive film 900 and the lower films thereof, i.e., the data metal layer 300, the ohmic contact layer 500 and the semiconductor layer 400 are etched. The data metal layer 300 and the lower films thereof are left the same in the data layer pattern portion A, only the semiconductor layer 400 is left in the channel portion C, and the three layers 300, 500 and 400 all are removed to expose the gate insulating layer 110 in the other portions B.

Figure 6A:
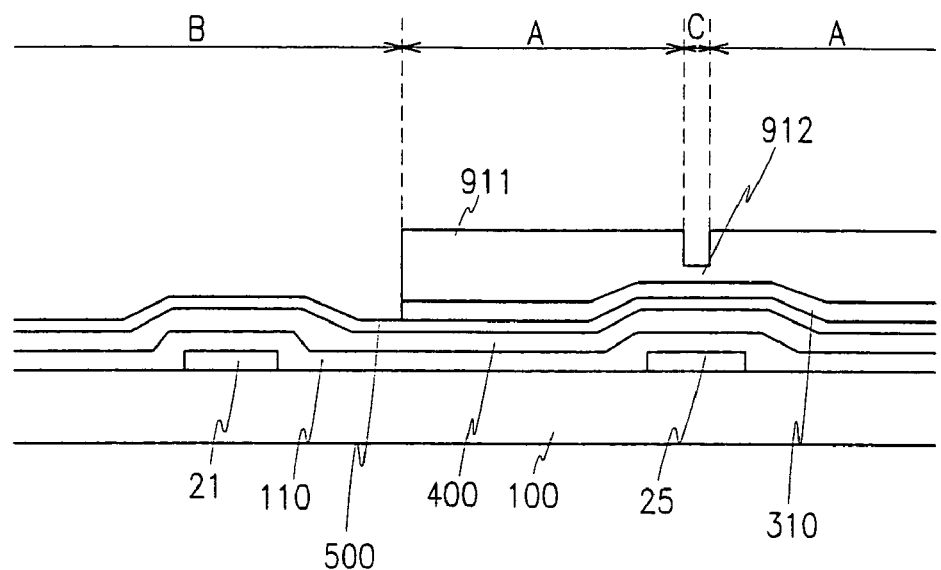
Figure 6B:
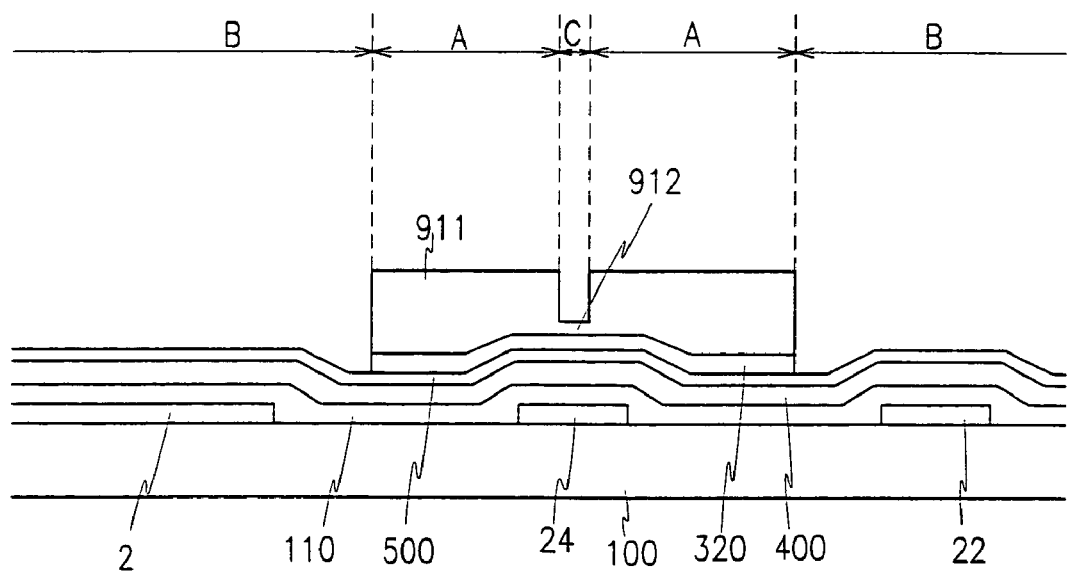

First, as shown in FIGS. 6A and 6B, the data metal layer 300 exposed in the other portions B is removed to expose the ohmic contact layer 500 thereof. Both a dry etching and a wet etching are used in this process. Etching is performed under a condition that the data metal layer 300 is etched and the photosensitive film patterns 911 and 912 are hardly etched. However, it is not easy to find the condition that only the data metal layer 300 is etched and the photosensitive film patterns 911 and 912 is not etched in the dry etching, and therefore it may be performed under a condition that the photosensitive patterns 911 and 912 are etched, too. In this case, it is desirable that a thickness of the first portion 912 is thicker than that obtained in the wet etching, such that the lower data metal layer 300 is not exposed.

In this way, as shown in FIG. 6A and FIG. 6B, the data metal layer 300 in the channel portion C and the data layer pattern portion B, that is, only the data line 3 and the source electrode 301 of the display area, the drain electrode 302 and the source electrode 303 are left and the data metal layer in the other portions B are removed to expose the ohmic contact layer 500 thereof. The remaining data metal layers 310 and 320 have the same forms as the data layer patterns 3, 301, 302 and 303 except that the source electrode and the drain electrode, the data line 3 and the source electrode 301, and the drain electrode 302 and the source electrode 303 are not separated. In the meanwhile, when the dry etching is used, the photosensitive patterns 911 and 912 are etched to some extent of thickness.

Figure 7A:
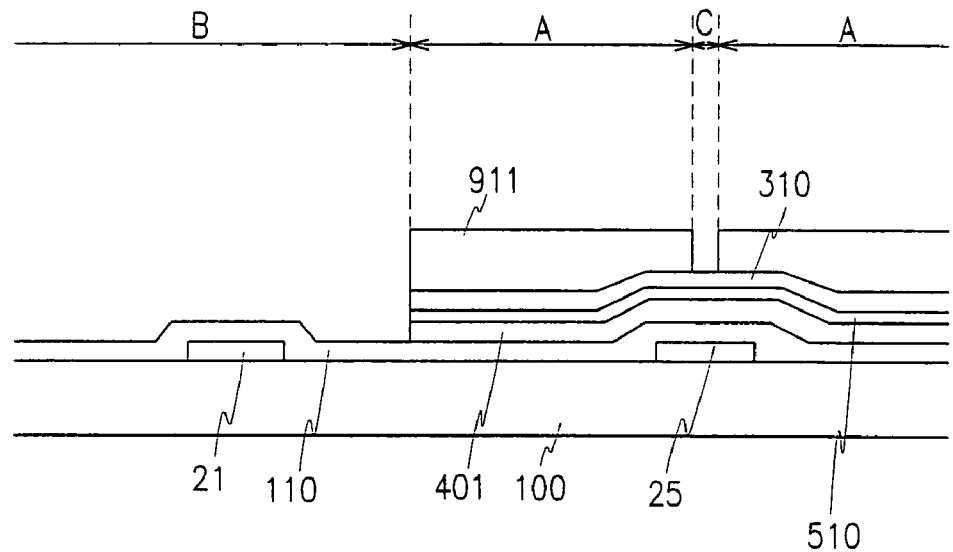
Figure 7B:
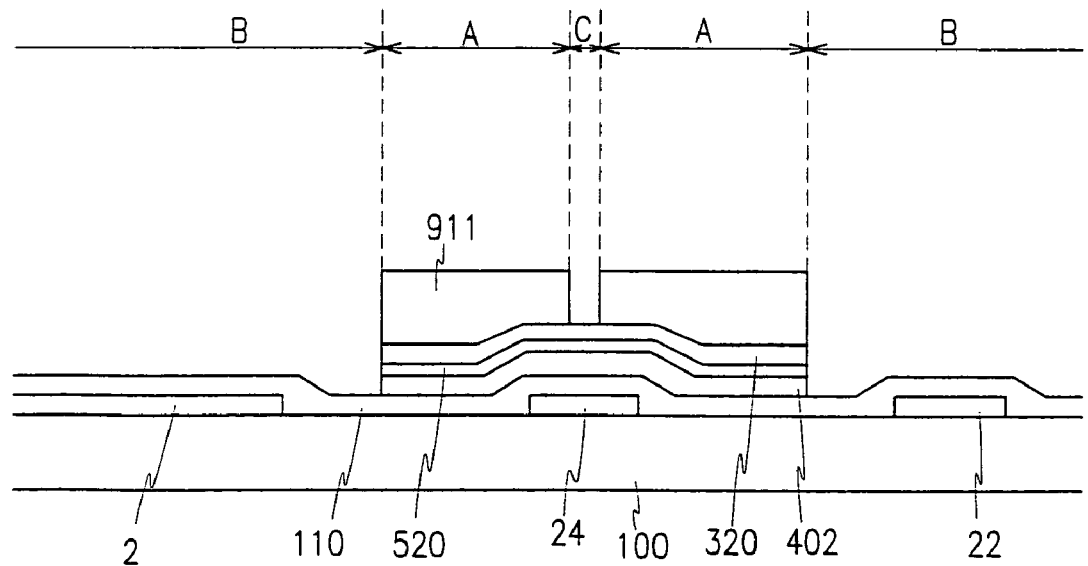

Next, as shown in FIG. 7A and FIG. 7B, the exposed ohmic contact layer 500 and the lower semiconductor layer 400 thereof in the other portions B are simultaneously removed together with the first portion by a dry etching. The etching of the ohmic contact layer 500 and the semiconductor layer 400 should be performed under a condition that the photosensitive film patterns 911 and 912, the ohmic contact layer 500 and the semiconductor layer 400 (the semiconductor layer and the middle layer hardly have etching selectivity) are simultaneously etched and the gate insulating layer 110 is not etched. Especially, it is preferable that the etching ratio of the photosensitive film patterns 911 and 912 and the semiconductor pattern 400 is almost the same. For example, when using a mixed gas of $SF_6$ and HCl or $SF_6$ and $O_2$ is used, the two layers may be etched by almost the same thickness. When the etching ratio of the photosensitive film patterns 911 and 912 and the semiconductor pattern 400 is the same, the thickness of the first portion 912 is the same as, or less than the sum of that of the semiconductor layer 400 and the ohmic contact layer 500.

In this way, as shown in FIGS. 7A and 7B, the first portion 912 in the channel portion C is removed to expose the remaining data metal layers 310 and 320, and the ohmic contact layer 500 and the semiconductor layer 400 in the other portions B are removed to expose the lower gate insulating layer 110 thereof. In the meanwhile, the second portion 911 in the data layer pattern portion A is also etched, and hence it becomes thinner. Moreover, the semiconductor patterns 401 and 402 are completed in this process. The reference numerals 510 and 520 refer to the lower ohmic contact layer patterns of the remaining data metal layer 310 and 320, respectively.

Then, photosensitive film remnants left in the surface of the data metal layers 310 and 320 in the channel portion C are removed through an ashing process.

Figure 8A:
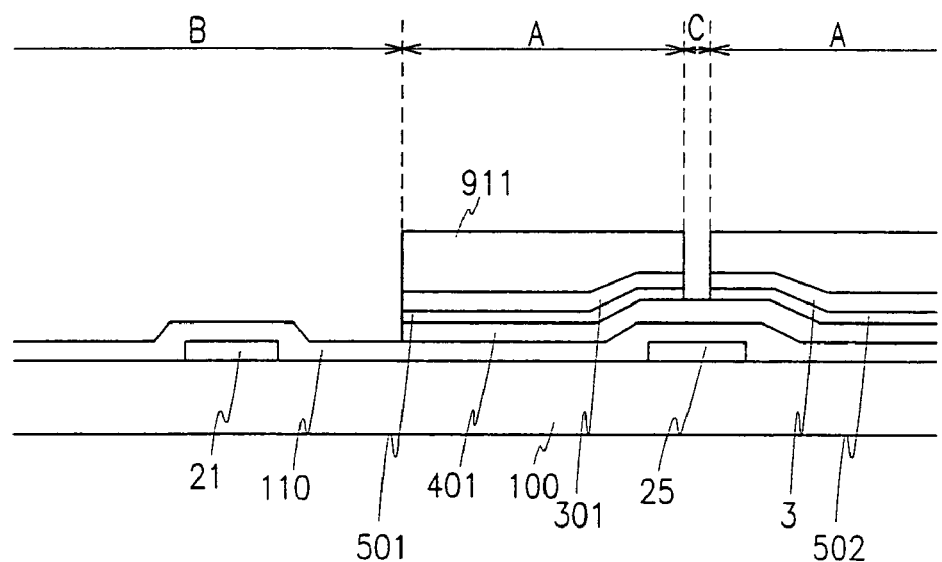
Figure 8B:
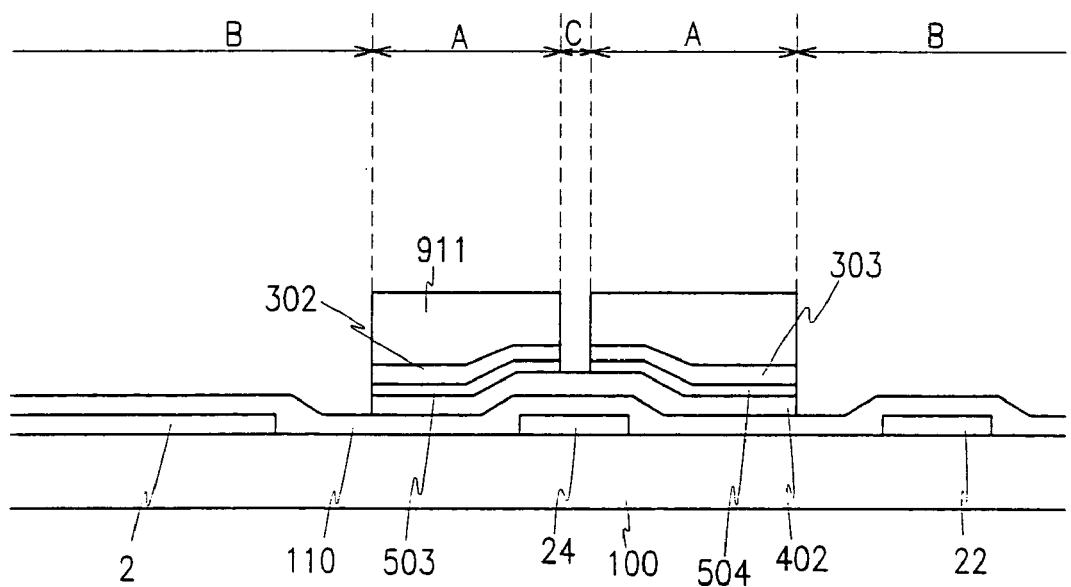

Next, as shown in FIGS. 8A and 8B, the data metal layers 310 and 320 and the lower ohmic contact layer patterns 510 and 520 thereof in the channel portion C are etched to be removed. The etching of both of them may be done using only a dry etching, the remaining data metal layers 310 and 320 may be etched by a wet etching, and the ohmic contact layer patterns 510 and 520 may be etched by a dry etching. In case of the former, it is preferable that the remaining data metal layers 310 and 320 and the lower ohmic contact layers 510 and 520 thereof are etched under a condition that its etching selection ratio is large, this is because, if not large, it is not easy to find an end point of etching, and thereby, it is not easy to adjust the thickness of the semiconductor patterns 401 and 402 left in the channel portion C. In case of the latter to perform the dry etching and the wet etching one after the other, a side portion of the remaining data metal layers 310 and 320 is etched by the wet etching, however, the ohmic contact layer patterns 510 and 520 is hardly etched by the dry etching, thereby forming the step-shaped. As an example of an etching gas used to etch the remaining data metal layers 310 and 320 and the lower ohmic contact layer patterns 510 and 520, there is a mixed gas of aforementioned $CF_4$ and HCl or a mixed gas of $CF_4$ and $O_2$. If using the mixed gas of $CF_4$ and $O_2$, the semiconductor patterns 401 and 402 with an even thickness can be left. In this regard, as shown in FIG. 16B, part of the semiconductor patterns 401 and 402 are removed and thus its thickness becomes smaller, and here, the second portion 911 of the photosensitive film patterns is also etched to some extent of thickness. This etching is performed under a condition that the gate insulating layer 110 is not etched, and it is preferable that the photosensitive film pattern is thick so that the second portion 911 is etched not to expose the lower data layer patterns 3, 301, 302 and 303.

In this way, the source electrode and the drain electrode of the display area, the data line 3 and the source electrode 301, the source electrode 303 and the drain electrode 302 are isolated each other, and simultaneously the data layer patterns 3, 301, 302 and 303 and the lower ohmic contact layer patterns 501, 502, 503 and 504 thereof are completed.

Finally, the second portion 911 of the photosensitive film left in the data layer pattern portion A is removed. However, the second portion 911 may be removed after the data metal layers 310 and 320 in the channel portion C are etched and before the lower ohmic contact layer patterns 510 and 520 thereof are removed.

As described above, a wet etching and a dry etching may be used one after the other, or only a dry etching may be used. The latter is relatively simple in the process owing to using one kind of etching but an etching condition is not easy to find. In contrast, the former is complex relative to the latter but an etching condition is relatively easy to find.

Next, a passivation layer 120 is formed by depositing an inorganic insulating layer such as SiNx, SiOx, etc., or by coating an organic insulating layer or by growing a-Si:C:O film or a-Si:O:F film by a chemical vapor deposition. Here, a-Si:C:O film or a-Si:O:F film is an inorganic insulating layer and has a very low dielectric in a range of 2 to 4. In case of a-Si:C:O film, $SiH(CH_3)_3$, $SiO_2(CH_3)_4$, $(SiH)_4O_4(CH_3)_4$, $Si(C_2H_5O)_4$, etc., are used as a basic source, and an oxidant such as $N_2O$ or $O_2$ and a mixed gas such as Ar or He are flowed to deposit a-Si:C:O. In addition, in case of a-Si:O:F film, a mixture gas of $O_2$ and $SiH_4$, $SiF_4$, etc., is flowed to deposit it. Here, $CF_4$ may be added as an auxiliary fluoride source.

Figure 9A:
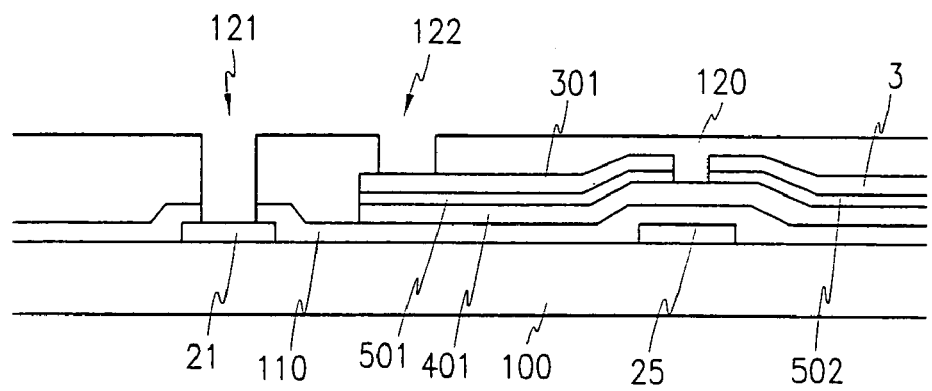
Figure 9B:
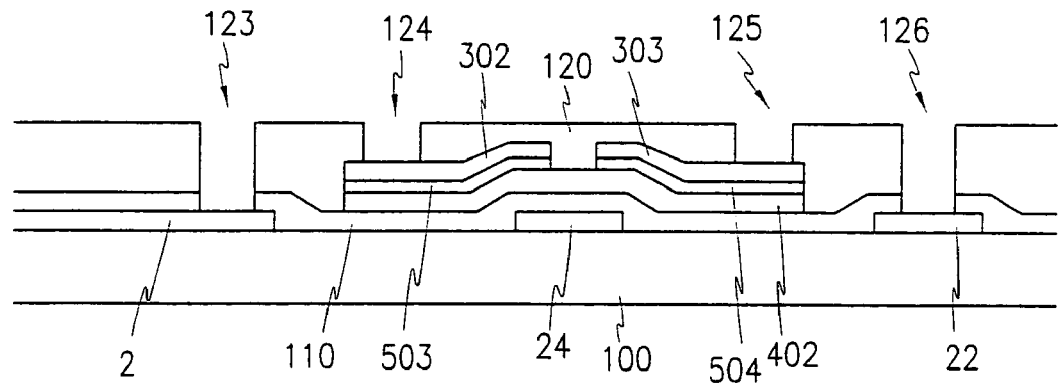

Next, as shown in FIGS. 9A and 9B, the passivation layer 120 is etched together with the gate insulating layer 110 by a photo etching to form the first to sixth contact holes for exposing the data inspection signal line 21, the source electrode 301, the gate line 2, the drain electrode 302 and the gate inspection signal line 22, respectively. In this case, contact holes (not shown) for exposing a gate pad (not shown), a data pad (not shown) and a drain electrode (not shown) are also formed.

Finally, as shown in FIGS. 3A and 3B, ITO or IZO having the thickness of 4000 Å to 500 Å and deposited and photo-etched to form first to third connecting portions 101, 102 and 103. Also, a pixel electrode of a display area (not shown), an auxiliary gate pad (not shown) connected to the gate pad and an auxiliary data pad (not shown) connected to the data pad are formed in this process.

Where the first to third connecting portions 101, 102 and 103, the pixel electrode, the auxiliary gate pad and the auxiliary data pad are formed of IZO, data wire or gate wire metal exposed through contact holes in the process for forming these components is prevented from being corroded since a Cr etchant can be used as an etchant. There are $HNO_3/(NH_4)_2Ce(NO_3)_6/H_2O$, etc., as such a Cr etchant. In addition, it is preferable that IZO is deposited in at a temperature of room temperature to 200° C. in order to minimize the contact resistance of the contact portion, and that a target for forming an IZO film includes $In_2O_3$ and ZnO, and that a content of ZnO is in a range of 15–20 atm %.

In the meanwhile, it is preferable that nitrogen is used as a gas employed in the pre-heating before ITO or IZO is deposited, and this is because a metal oxide film is prevented being formed on the upper side of metal film exposed through the contact holes 121, 122, 123, 124, 125 and 126.

The process of forming a TFT for inspection and a structure thereof when applying a method of manufacturing a TFT panel using four times of photo etching processes has been described. A method of manufacturing a TFT panel and a structure thereof using five times of photo etching processes will be described below.

First, its structure will be described.

Figure 10A:
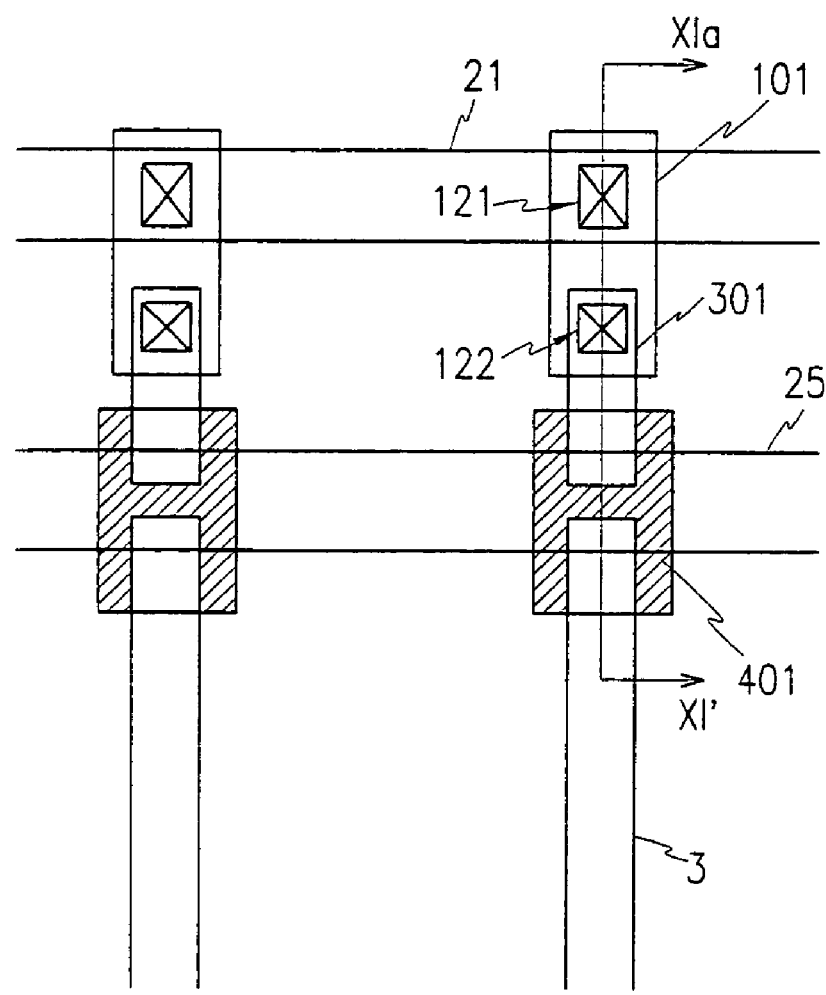
FIGS. 10A and 10B are layouts of a thin film transistor according to the second embodiment of the present invention, each of which is A and B shown in FIG. 1.
Figure 10B:
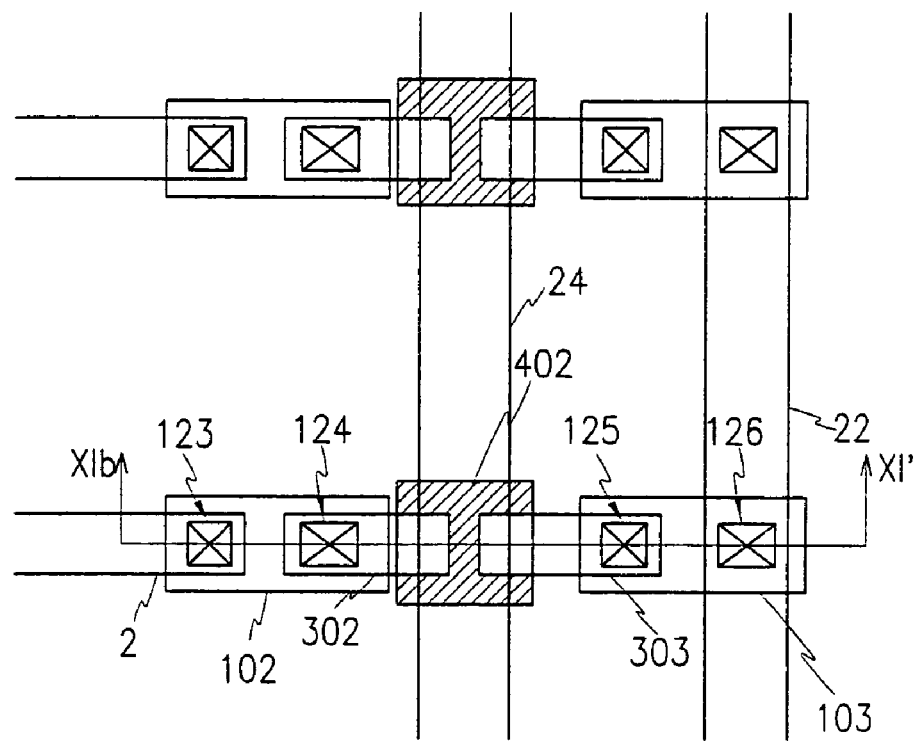
Figure 11A:
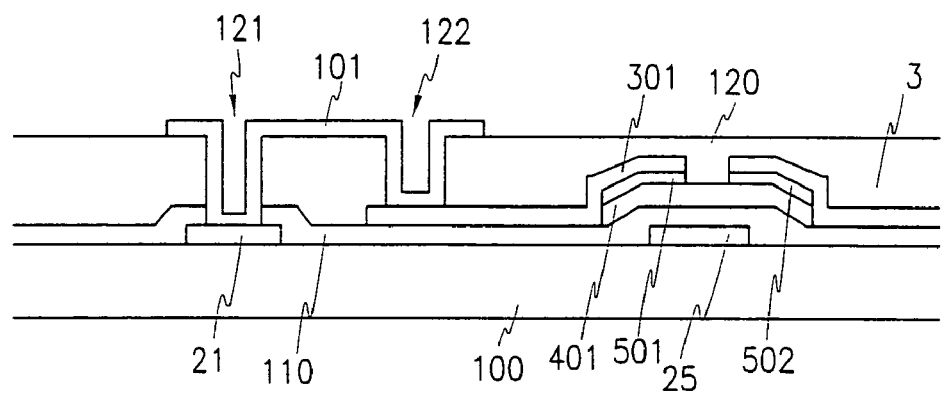
FIGS. 11A and 11B are cross sectional views taken along line XIa–XIa' of FIG. 10A and line XIb–XIb' of FIG. 10B, respectively.

FIGS. 10A and 10B are layouts of a thin film transistor according to the second embodiment of the present invention, each of which is A and B shown in FIG. 1, and FIGS. 11A and 1B are cross sectional views taken along line XIa–XIa' of FIG. 10A and line XIb–XIb' of FIG. 10B, respectively.

First, a data TFT A for inspection will be described with reference to FIG. 10A and FIG. 11A.

The data inspection signal line 21 and the data driving signal line 25 are formed extending in a transverse direction on the insulating substrate 100, and the gate insulating layer 110 are formed on the data inspection signal line 21 and the data driving signal line 25. On the gate insulating layer 110, the first semiconductor pattern 401 is formed as a shape of an island on the upper side of the data driving signal line 25. Ohmic contact layers 501 and 502 are formed on the first semiconductor pattern 401, and expose therebetween a portion of the first semiconductor 401 corresponding to the data driving signal line 25. The data line 3 and the source electrode 301 for data extending in a transverse direction are formed on the ohmic contact layers 501 and 502. The data line 3 extends onto one ohmic contact layer 501, and the source electrode 301 has the same pattern as the other ohmic contact layer 501. The passivation layer 120 is formed on the data line 3 and the source electrode 301 and has the first contact hole 121 for exposing the data inspection signal line 21 and the second contact hole 122 for exposing the source electrode 301. The first connecting portion 101 for connecting the data inspection signal line 21 with the source electrode 301 is formed on the passivation layer 120.

Next, a gate TFT B for inspection will be described with reference to FIG. 10B and FIG. 11B.

The gate inspection signal line 22 and the gate driving signal line 24 are formed extending in a longitudinal direction on the insulating substrate 100, and the gate line 2 are formed in a transverse direction. The gate insulating layer 110 are formed on the gate line 2, the gate inspection signal line 22 and the gate driving signal line 24. On the gate insulating layer 110, the second semiconductor pattern 402 is formed as a shape of an island on the upper side of the gate driving signal line 24. Ohmic contact layers 503 and 504 are formed on the second semiconductor pattern 402, and expose therebetween a portion of the second semiconductor pattern 402 corresponding to the gate driving signal line 24. The drain electrode 302 for gate and the source electrode 303 are formed on the ohmic contact layers 503 and 504. The drain electrode 302 extends onto one ohmic contact layer 503, and the source electrode 303 extends onto the other ohmic contact layer 504. The passivation layer 120 is formed on the drain electrode 302 and the source electrode 303 and has the third contact hole 123 for exposing the gate line 2, the fourth contact hole 124 for exposing the drain electrode 302, the fifth contact hole 125 for exposing the source electrode 303 and the sixth contact hole 126 for exposing the gate inspection signal line 22. The second connecting portion 102 for connecting the gate line 2 with the drain electrode 302 and the third connecting portion 103 for connecting the source electrode 303 with the gate inspection signal line 22 are formed on the passivation layer 120.

Then, a method of manufacturing a TFT having such a structure will be described.

First, a gate metal layer is deposited and patterned on the insulating substrate to form the gate line 2, the gate inspection signal line 22, the gate driving signal line 24, the data inspection signal line 21 and the data driving signal line 25.

Next, three layers, the gate insulating layer 110 made of SiNx, the semiconductor layer made of an amorphous silicon and the ohmic contact layer made of a doped amorphous silicon, are deposited in succession, and then, the semiconductor layer and the ohmic contact layer are etched to form the semiconductor layers 401 and 402 having an island shape and the ohmic contact layer patterns having the same shape as the semiconductor layers 401 and 402.

Next, a data metal layer is deposited and photo-etched to form a data layer pattern including the data line intersecting the gate line 2, the source electrode 301 for data, the drain electrode 302 for gate and the source electrode 303 for gate.

Then, the ohmic contact layers not blocked by the data layer pattern are etched to be divided into opposite sides around the gate driving signal line 24 and the data driving signal line 25, thereby exposing the semiconductor layer patterns 401 and 402 among the ohmic contact layer patterns 501, 502, 503 and 504. An oxygen plasma treatment may be performed in order to stabilize the exposed surface of the semiconductor patterns 401 and 402.

Next, the passivation layer 120 is formed by depositing an inorganic insulating layer such as SiNx, SiOx, etc., or by depositing an organic insulating layer, or by growing a-Si: C:O film or a-Si:O:F film by a chemical vapor deposition.

Then, the passivation layer 120 is patterned with the gate insulating layer 110 by a photo-etching to form first to sixth contact holes 121, 122, 123, 124, 125 and 126.

Figure 11B:
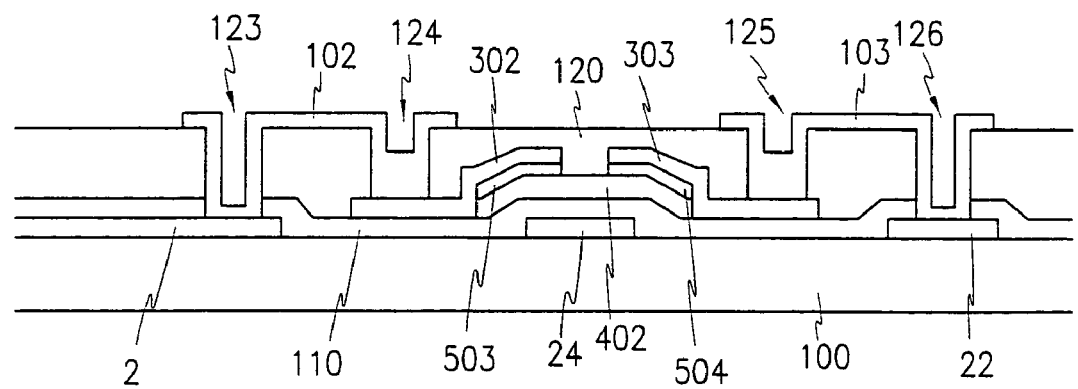

Finally, as shown in FIGS. 11A and 11B, ITO film or IZO film is deposited and photo-etched to form first to third connecting portions 101, 102 and 103.

The TFT panel in which each of the gate TFT for inspection and the data TFT for inspection is applied with the same scan signal and image signal to be driven together has been described. However, it is not possible to detect a short generated between the neighboring lines. A TFT having a structure capable of detecting the short generated between the neighboring lines will be described below.

Figure 12:
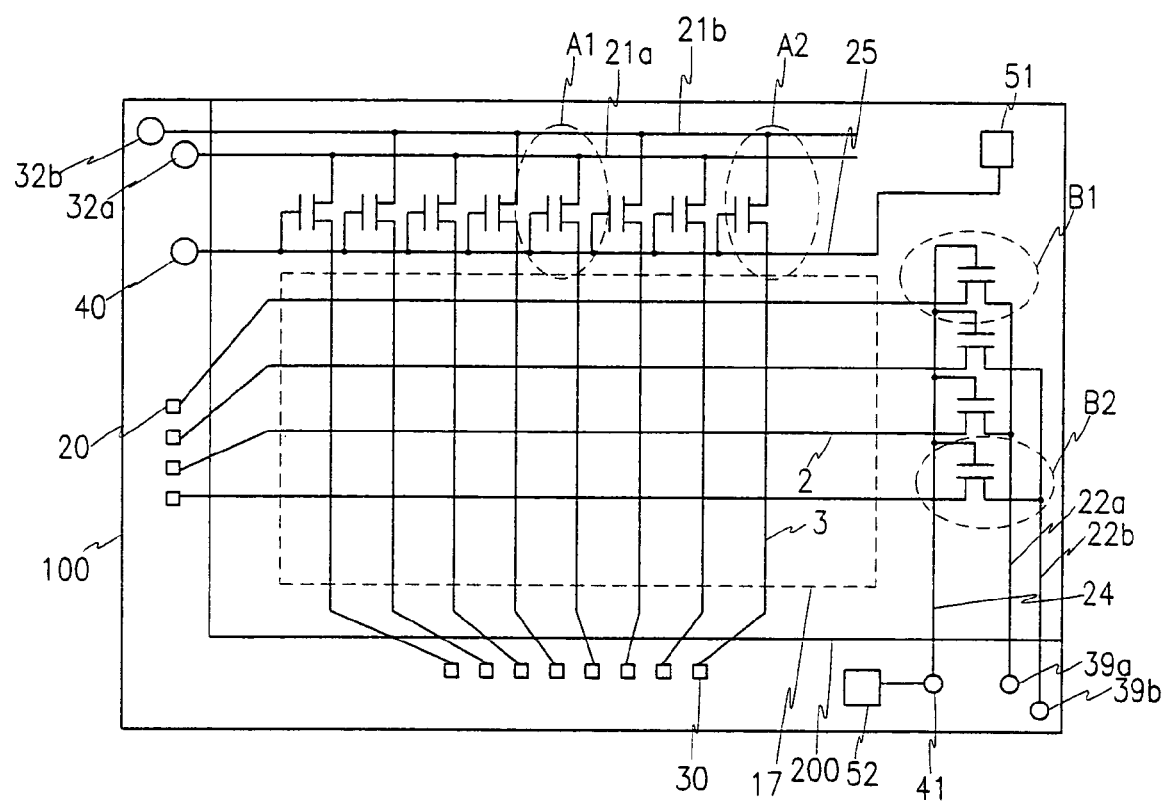
FIG. 12 is a layout of a thin film transistor according to a third embodiment of the present invention.

FIG. 12 is a circuitry diagram of a thin film transistor panel according to a third embodiment of the present invention.

A plurality of gate lines 2 extend in a transverse direction and a plurality of data lines 3 insulated to intersect the gate lines 2 in a longitudinal direction are formed on the insulating substrate 100. A plurality of gate pads 20 connected to gate driving ICs are connected to the first end of the gate lines 2, and a plurality of data pads 30 connected to date driving ICs are connected to the second end of the data lines 3. The gate lines 2 and the data lines 3 intersect each other to define a pixel area, and a group of the pixel areas form the display area 17. First and second gate thin film transistors (hereinafter, referred to as TFT) ($B_1$, $B_2$) for inspection are connected to the third end opposite the first end of the gate line 2, and first and second data TFTs ($A_1$, $A_2$) for inspection are connected to the fourth end opposite the second end of the data line 3. The first gate TFT B is connected to a first gate inspection signal line 22a and the gate driving signal line 24, and the second gate TFT $B_2$ is connected to a second gate signal line 22b and the gate driving inspection signal line 24. In addition, the first data TFT $A_1$ is connected to a first data inspection signal line 21a and the gate driving signal line 25 and the second data TFT $A_2$ is a second data inspection signal line 21b and the data driving signal line 25. The gate line 2 is connected to a drain electrode of the first and second gate TFTs $B_1$ and $B_2$, and the gate driving signal line 24 is connected to the source electrode of the first and second gate TFTs $B_1$ and $B_2$. The first inspection signal line 22a is connected to the source electrode of the first gate TFT $B_1$, and the second gate inspection signal line is connected to the source electrode of the second gate TFT $B_2$. In addition, the data line 3 is connected to drain electrodes of the first and second data TFTs $A_1$ and $A_2$, and the data driving signal line 25 is connected to gate electrodes of the first and second data TFTs $A_1$ and $A_2$. The first data inspection signal line 21a is connected to the source electrode of the first data TFT $A_1$, and the second data inspection signal line 21b is connected to the source electrode of the second data TFT $A_2$. The first and second data inspection signal lines 21a and 21b, the first and second gate inspection signal lines 22a and 22b, the gate driving signal line 24 and the data driving signal line 25 are connected to respective one end of first to sixth data pads 32a, 32b, 39a, 39b, 41 and 40 for inspection. In this case, the gate driving signal line 24 is connected to the gate $V_{off}$ terminal 52 through the fifth pad 41 and the data driving signal line 25 is connected to the data $V_{off}$ terminal 51. That is, all the gate electrodes of the gate TFTs $B_1$ and $B_2$ are connected to the gate $V_{off}$ terminal 52, and all the gate electrodes of the data TFTs $A_1$ and $A_2$ are connected to the data $V_{off}$ terminal 51. The $V_{off}$ terminals 51 and 52 are kept constant as $V_{off}$ voltages by being connected with $V_{off}$ voltage source via the FPC in a later process. Thus, TFTs A and B are always in an off state in which is the same as a disconnection state. Accordingly, a diamond-cutting or a laser-cutting does not need to be performed in order to divide a wire for inspection with a data line and a gate line.

The substrate 200 that includes a common electrode, a black matrix and color filters is facing with the substrate 100.

In the meanwhile, since the gate lines 2 are in turn connected to the first gate TFT $B_1$ and the second gate TFT $B_2$ and the data lines 3 are in turn connected to the first data TFT $A_1$ and the second data TFT $A_2$, it is possible to drive the data line 3 and the gate line 2 in turn by driving the TFTs $A_1$, $A_2$, $B_1$ and $B_2$ separately. Accordingly, it is possible to detect a short in the gate line 2 and the data line 3.

Figure 13:
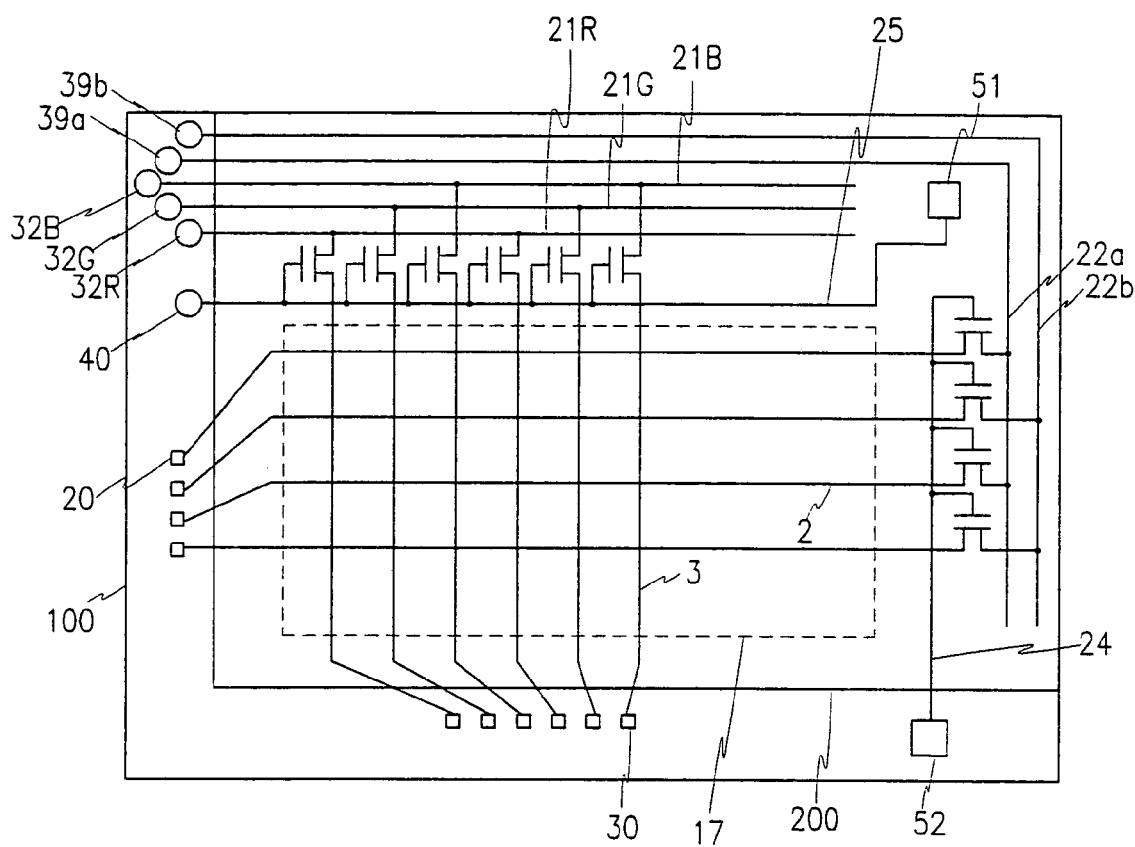
FIG. 13 is a circuitry diagram of a thin film transistor according to a fourth embodiment of the present invention.

FIG. 13 is a circuitry diagram of a TFT panel according to a fourth embodiment of the present invention.

In a TFT panel according to the fourth embodiment of the present invention, data TFTs for inspection are connected to three data inspection signal lines 21R, 21G and 21B in turn. Gate signal lines 22a and 22b are extended such that pads 39a and 39b of the gate signal lines 22a and 22b are formed on a position neighboring with the pads 32R, 32G and 32B of the data inspection signal lines 21R, 21G and 21B.

Since the data TFTs are connected to three data inspection signal lines 21R, 21G and 21B in turn, it is possible to inspect each color of red, green and blue. By forming the pads 39a and 39b of the gate signal lines 22a and 22b on the position neighboring with the pads 32R, 32G and 32B of the data inspection signal lines 21R, 21G and 21B, the connection with the driving device for inspection is facilitated, and this is applicable to aforementioned first to third embodiments and a fifth embodiment described later.

Figure 14:
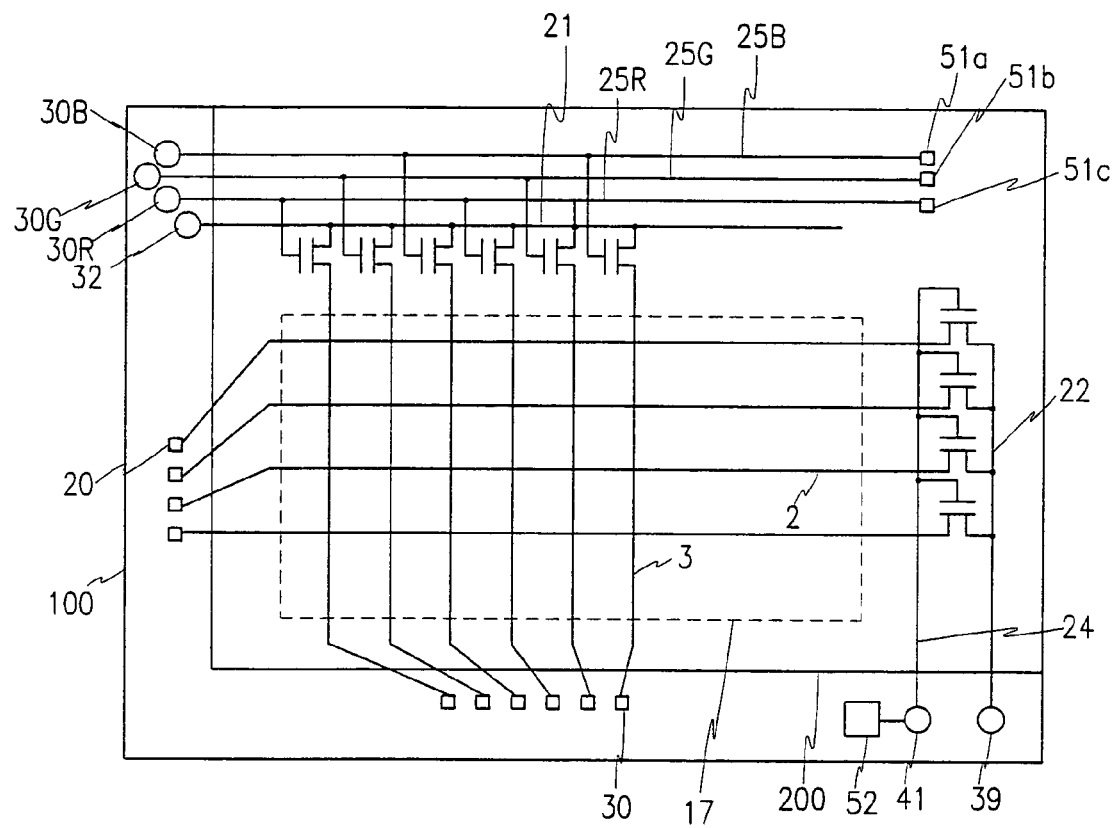
FIG. 14 is a circuitry diagram of a thin film transistor according to a fifth embodiment of the present invention.

FIG. 14 is a circuitry diagram of a TFT panel according to a fifth embodiment of the present invention.

As in the fourth embodiment, in the fifth embodiment, inspection of respective colors is possible by connecting the data TFTs for inspection to three data driving signal lines 25R, 25G and 25B, however, its connection state is different from that of the fourth embodiment. That is, the source electrodes of the data TFTs for inspection are connected to three data inspection signal lines 21R, 21G and 21B in turn in the fourth embodiment, but gate electrodes of the data TFTs for inspection are connected to three data driving signal lines 25R, 25G and 25B in turn. In addition, the gate TFTs for inspection, as in the first embodiment, are all connected to the gate inspection signal lines 22 and the gate driving signal lines 24. In this structure, it is possible to detect a short between the data lines.

In a sixth embodiment below, a TFT panel for liquid crystal display capable of VI using a logic circuit is formed.

Figure 15:
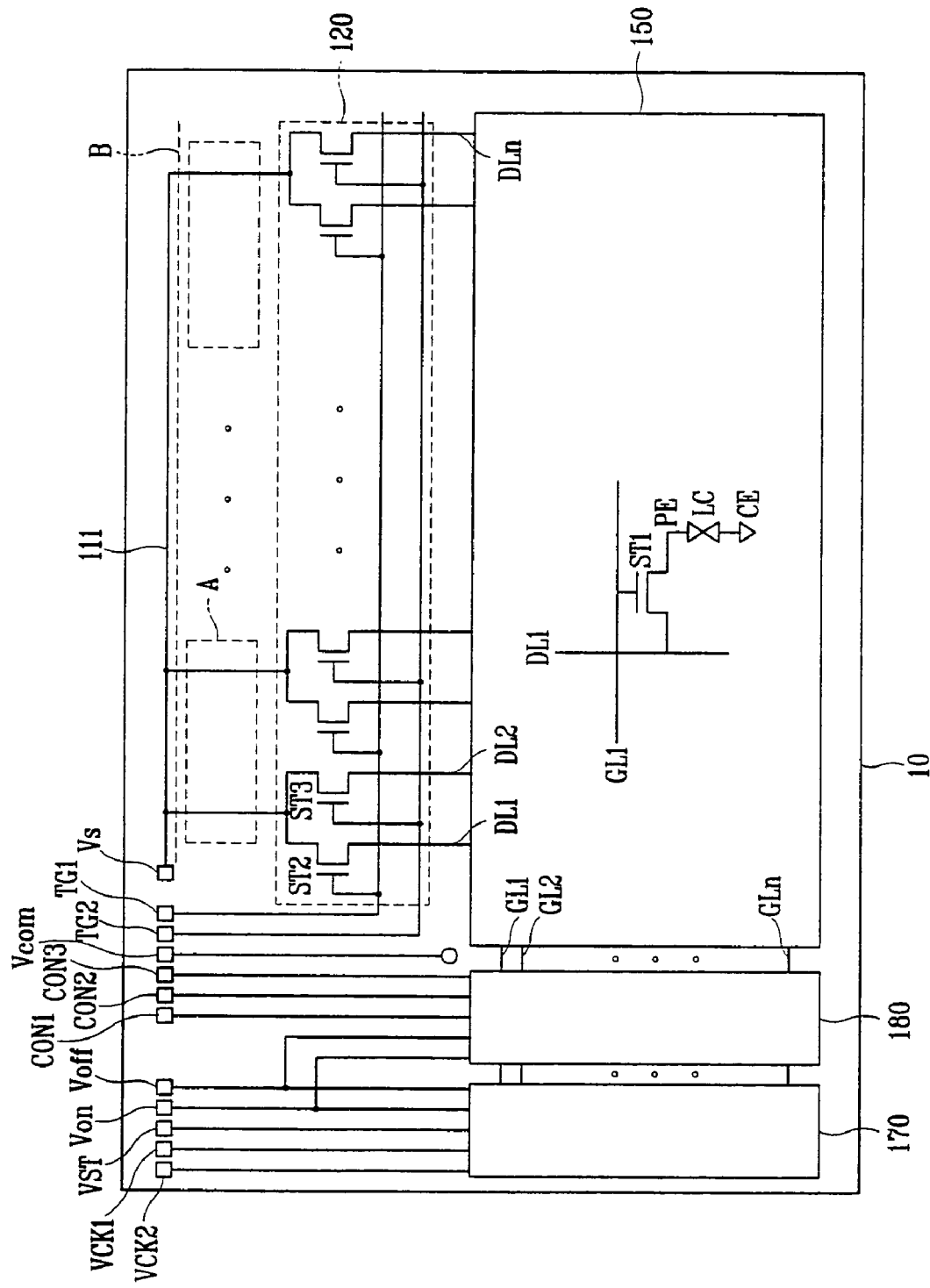
FIG. 15 is a circuitry diagram of a thin film transistor according to a sixth embodiment of the present invention.
Figure 16:
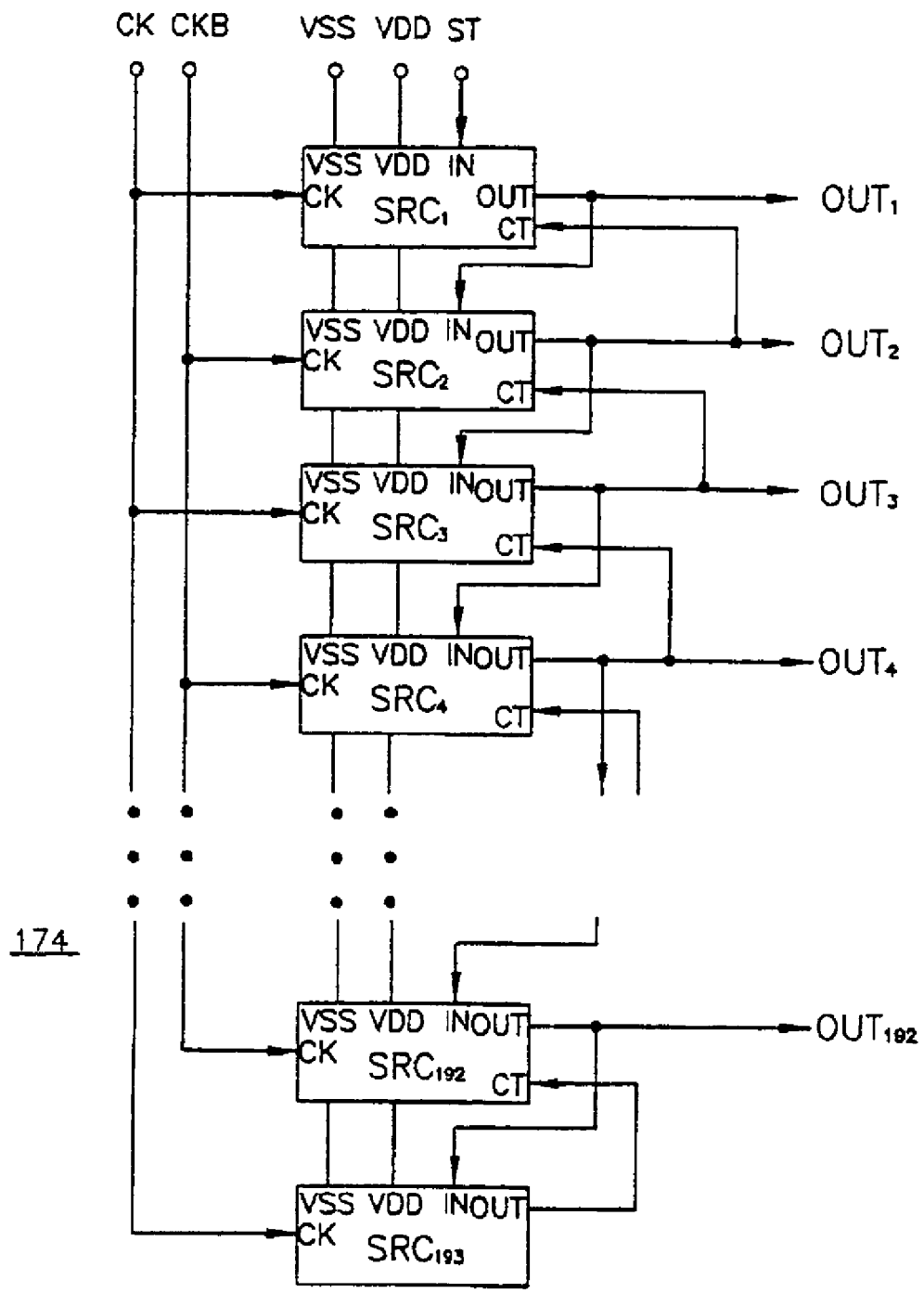
FIG. 16 is a block diagram of a shift register of a gate driving circuit.
Figure 17:
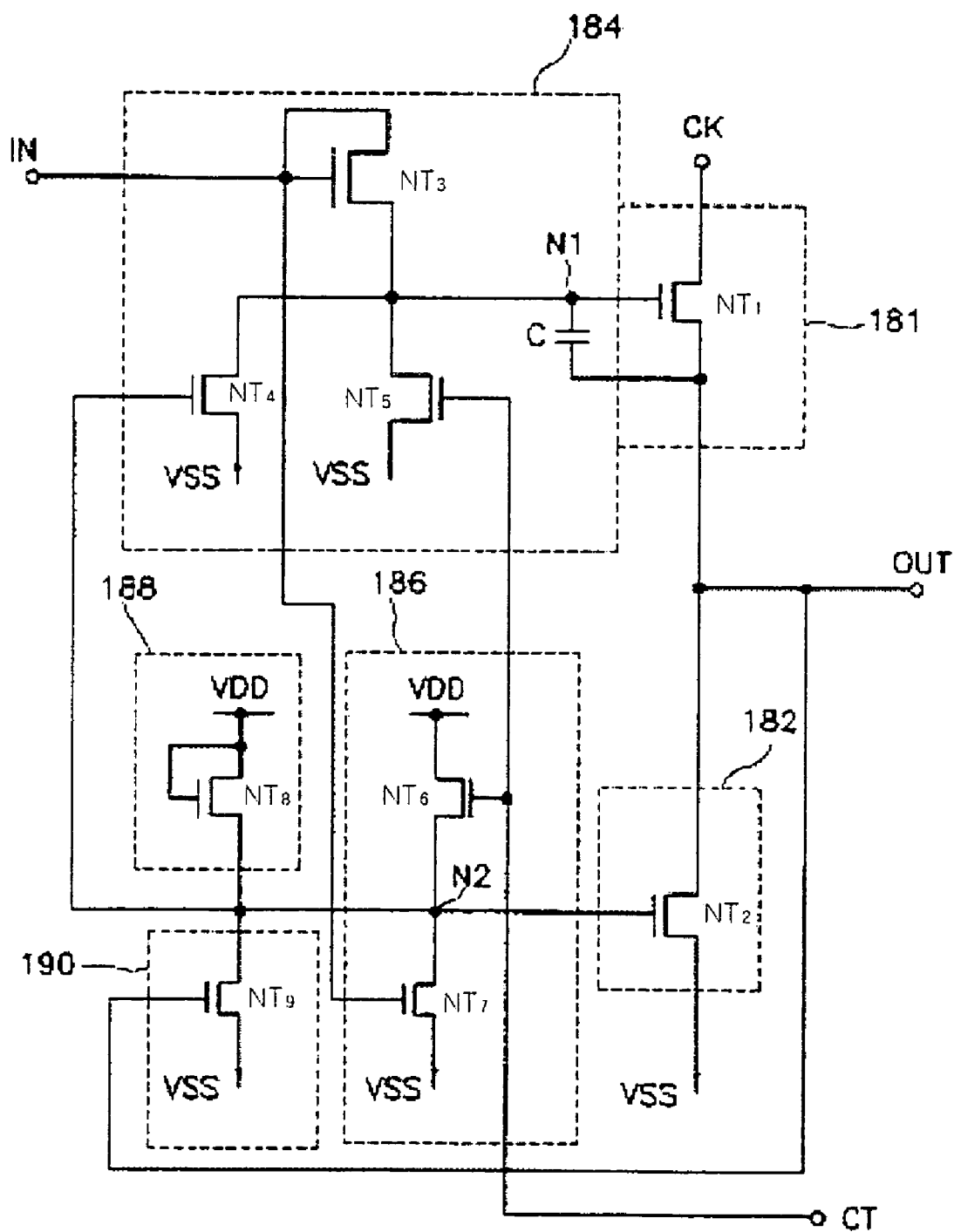
FIG. 17 is a detailed circuitry diagram in a stage of the shift register.
Figure 18:
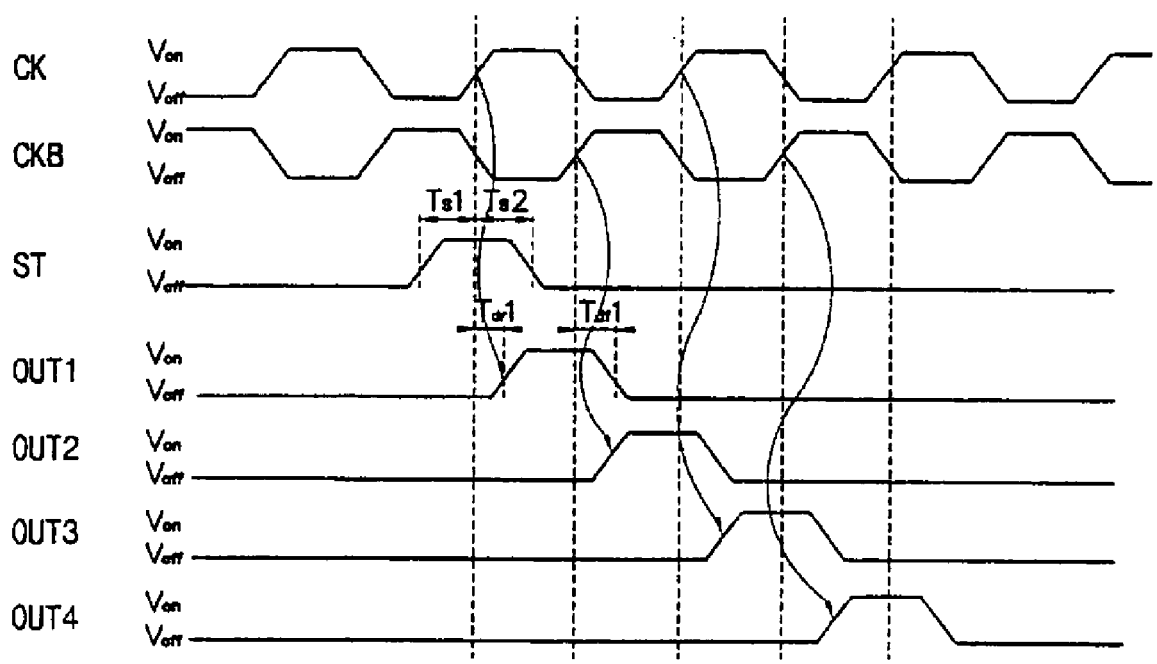
FIG. 18 is a timing diagram of respective portions of FIG. 17.
Figure 19:
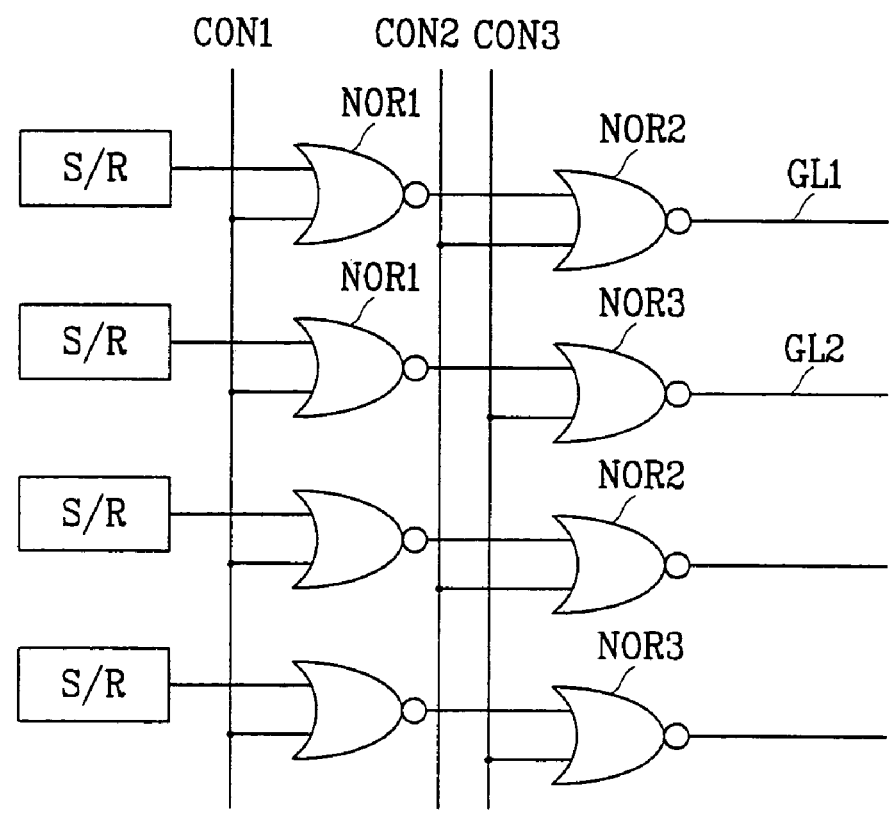
FIG. 19 is a detailed circuitry diagram of a logic circuit for VI of FIG. 15.

FIG. 15 is a circuitry diagram of a thin film transistor according to a sixth embodiment of the present invention, FIG. 16 is a block diagram of a shift register of a gate driving circuit, FIG. 17 is a detailed circuitry diagram in a stage of the shift register, FIG. 18 is a timing diagram of respective portions of FIG. 17, and FIG. 19 is a detailed circuitry diagram of a logic circuit for VI of FIG. 15.

As an example, a TFT panel for an LCD will be described below.

Referring to FIG. 15, a display area 150 having a plurality of pixels, a gate driving circuit 170, a logic circuit 180 for VI, a transmission gate portion 120 TG including a plurality of transistors ST2 and ST3 as a part of a data driving circuit, a plurality of signal lines 111 for VI and a plurality of signal pads $V_{on}$, $V_{off}$, VCK1, VCK2, VST, CON1, CON2, CON3, TG1, TG2 and Vcom are formed on a TFT panel 10. These elements are formed together in the process of forming a TFT and a pixel electrode.

The display area 150 includes m data lines DL1–DLm extending in a row direction and n gate lines GL1–GLn extending in a column direction.

A switching transistor ST1 is formed in an intersecting point of the data lines and the gate lines. A drain of the switching transistor ST1 is connected to the data line Dli, and its gate is connected to the gate line Gli. A source of the switching transistor ST1 is connected to a transparent pixel electrode PE. A liquid crystal LC is located in a transparent common electrode formed between the transparent pixel electrode PE and a color filter panel (not shown).

An amount of transmitted light is adjusted by controlling an alignment of the liquid crystal depending on voltages applied to the transparent pixel electrode PE and the transparent common electrode CE, thereby representing the gray of respective pixels.

The gate driving circuit 170 shown in FIG. 15 will be described in detail with reference to FIG. 16 to FIG. 18.

The gate driving circuit 170 includes a shift register. The shift register 174 shown in FIG. 16 has a plurality of stages SRC1–SRC193 in cascade connection. That is, respective output terminals OUT of the stages are connected to input terminals IN of next stages. The stages are composed of stages SRC1–SRC192 with the number of the stages (192 in this embodiment) corresponding to the number of the gate lines and one dummy stage SRC193. Each stage has an input terminal IN, an output terminal OUT, a control terminal CT, a clock signal input terminal CK, a first power voltage terminal VSS and a second power voltage terminal VDD. In this case, the input terminal IN of the first stage SRC1 is connected to VST pad, the first power voltage terminal VSS to Voff pad and the second power voltage terminal VDD to Von pad. In addition, the clock signal input terminals CK of the stages SRC1–SRC193 are connected to VCK1 or VCK2.

A start signal ST shown in FIG. 18 is inputted to the input terminal of the first stage. Here, the start signal is a pulse signal in synchronization with a vertical synchronizing signal.

The output signals OUT1–OUT192 of respective stages are connected to related gate lines. The odd stages SRC1 and SRC3 are provided with the first clock signal CK and the even stages SRC2 and SRC4 are provided with the second clock signal CKB. The first clock signal CK and the second clock signal CKB have an opposite phase each other.

The control terminal of each stage (e.g., SRC1) is provided with the output signal (e.g., OUT2) of the next stage (e.g., SRC2) as a control signal. That is, the control signal inputted to the control terminal CT is delayed by its own duty period.

Therefore, since the output signals of respective stages are sequentially generated with active intervals (high states), the horizontal lines corresponding to the active intervals of the respective output signals are selected.

Referring to FIG. 17, an exemplary configuration of a circuit of respective stages SRC1–SRC193 will be described in detail.

As shown in FIG. 17, the shift register 174 of each stage includes a pull-up means 181, a pull-down means 182, a pull-up driving means 184, a pull-down driving means 186, a floating-prevention means 188 and a turn-on prevention means 190.

The pull-up means 181 includes a pull-up NMOS transistor NT1 having a drain coupled to the clock signal input terminal CK, a gate coupled to a first node N1 and a source coupled to the output terminal OUT.

The pull-down means 182 includes a pull-down NMOS transistor NT2 having a drain coupled to the output terminal OUT, a gate coupled to a second node N2 and its source coupled to the first power voltage VSS.

The pull-up driving means 184 includes a capacitor C and NMOS transistors NT3–NT5. The capacitor is connected between the first node N1 and the output terminal OUT. The transistor NT3 has a drain and a gate commonly coupled to the input terminal IN and a source coupled to the first node N1. The transistor NT4 has a drain coupled to the first node N1, a gate coupled to the second node N2 and a source coupled to the first power voltage VSS. The transistor NT5 has a drain coupled to the first node N1, a gate coupled to the control terminal CT and a source coupled to the first power voltage VSS.

The pull-down driving means 186 includes two NMOS transistors NT6 and NT7. The transistor NT6 has a drain coupled to the second power voltage VDD, a gate coupled to the control terminal CT and a source coupled to the second node N2. The transistor NT7 has a drain coupled to the second node N2, a gate coupled to the input terminal IN and a source coupled to the first power voltage VSS.

The floating prevention means 188 includes NMOS transistor NT8 having a drain and a gate commonly coupled to the second power voltage VDD and a source coupled to the second node N2. The transistor NT8 is configured of a relatively small size, for example, one twentieth of that of the transistor NT7.

The turn-on prevention means 190 includes NMOS transistor NT9 having a drain coupled to the second node N2, a gate coupled to the output terminal OUT and a source coupled to the first power voltage VSS. The size of the transistor NT9 to the transistor NT7 is about 1:2.

As shown in FIG. 18, when the first and second clock signals CK and CKB and the scan start signal ST are provided to the shift register 170, the first stage SRC1 responses to a leading edge of the scan start signal ST to delay high level intervals of the first clock signals by a specific time (Tdr1), then generates an output signal to the output terminal.

The active interval of the scan start signal ST has about ¼ period-leading phase relative to the high level intervals. The active interval of the start signal ST is divided into set time Ts1 from a leading edge of pulse, or a rising edge and hold time Ts2 from a trailing edge of pulse, or a trailing edge.

Accordingly, the leading edge of the output signal OUT1 has an about 2–4 µs delayed leading edge, i.e., a rising edge from the beginning point of the hold time Ts2. That is, the active interval or the high level interval of the first clock signal CK is delayed by Tdr1 to be generated at the output terminal OUT.

The reason of such a delay feature is that the capacitor C of the pull-up driving means 184 begins to be charged via the transistor NT3 from turn-off state of the transistor NT4 at the leading edge, then, after the charging voltage of the capacitor C is charged over a gate-to-source threshold voltage of the pull-up transistor NT1, the pull-up transistor turns on, and the high level interval of the first clock signal CK begins to be generated at the output terminal.

When the high level interval of the clock signal at the output terminal begins to be generated, this output voltage is bootstrapped in the capacitor C to increase the gate voltage of the pull-up transistor over turn-on voltage VDD. Accordingly, the pull-up transistor NT1 of NMOS transistor is kept a full turn-on state.

On the other hand, in the pull-down driving means 186, since the transistor NT7 turns off in the turn-off state of the transistor NT6, the voltage of the second node N2 is turned down to the first power voltage VSS. In this case, the transistor NT8 of the floating prevention means 188 is kept a turn-on state, however, since the turned on transistor NT7 is about twenty times larger than the transistor NT8, the second node N2 is turned down to the first power voltage VSS in the state of the second power voltage VDD. Thus, the pull-down transistor NT2 is shifted from turn-on state to turn-off state.

When the turn-on voltage (VON=VDD) is generated at the output terminal OUT, the transistor NT9 of the turn-on prevention means 190 is turned on, and the efficiency of driving the second node N2 with the first power voltage VSS increases about 50%. Therefore, the parasitic capacitor of drain-to-source of the pull-down transistor can prevent the voltage of the second node N2 from increasing at rising-shift of the output signal. Accordingly, it is possible to prevent misoperation of turning on the pull-down transistor at rising-shift of the output signal.

The output signal OUT1 of the output terminal OUT is generated by a duty cycle of the first clock signal CK.

When the output signal voltage of the output terminal OUT falls to the state of turn-off voltage (VOFF=VSS), the transistor NT9 is turned off to provide only the second power voltage VDD to the second node via the transistor NT8, and thereby the voltage of the second node N2 begins to rise from the first power voltage VSS to the second power voltage VDD. When the voltage of the second node begins to rise, the transistor NT4 begins to be turned on, and thereby, the charging voltage of the capacitor begins to be discharged through the transistor NT4. Accordingly, the pull-up transistor NT1 also begins to be turned off.

Thereafter, since the output signal of the next stage provided to the control terminal CT is increased to turn-on voltage, this causes the transistors NT5 and NT6 to be turned on. Therefore, the voltage of the second node N2 is rapidly increased to the second power voltage VDD provided by the transistors NT6 and NT8, and the voltage of the first node N1 is rapidly turned down to the first power voltage VSS through the transistors NT4 and NT5.

Consequently, the pull-up transistor NT1 is turned off and the pull-down transistor NT2 is turned on, and thus, the output terminal OUT is turned down from turn-on voltage Von to turn-off voltage $V_{off}$ of the first power voltage.

Even though the output signal of the next stage provided to the control terminal CT falls to low level to turn off the transistor NT6, the second node N2 is kept the biased state as the second power voltage through the transistor and the first node N1 is kept the biased state as the first power voltage VSS through the transistor NT4 holding turn-on state. Therefore, even though the threshold voltage of the transistors NT2 and NT4 is increased due to long term use, a stable operation is obtained without misoperation of turning off the transistor NT2 since the voltage of the second node N2 is kept the second power voltage VDD.

Next, a logic circuit 180 for VI shown in FIG. 15 will be described in detail with reference to FIG. 19.

The logic circuit 180 includes NOR gates of two rows. The first input terminals of NOR gate NOR1 in the first row are connected correspondingly to the output terminals of the respective stages SRC–SRC192, and the second input terminals thereof are all connected to CON1 pad. The first input terminals of the NOR gates NOR2 and NOR3 in the second row are connected correspondingly to the output terminals of the NOR gates NOR1, the second input terminals thereof are connected to CON2 pad or CON3 pad. In this embodiment of the present invention, the NOR gates NOR2 in odd column are connected to CON2 pad and the NOR gates NOR3 in even column are connected to CON3 pad.

On performing a visual inspection (VI), no signals are inputted from the stages SRC1–SRC2 of the gate driving circuit 170. Therefore, the signals of the first input terminal are always in the off (0) states. In this case, when the on (1) signals are inputted to the second input terminals via the CON1 pad, the off (0) signals are generated at the output terminal of the NOR1. That is, the off (0) signals are inputted to the first input terminals of the NOR2 and the NOR3. Therefore, either only the odd column or only the even column is turned on (1), or both of them are turned on (1) depending on the signals inputted to the second input terminals thereof. When the off (0) signals are inputted to the second input terminals of the NOR2 via the CON2 pad, the on (1) signals are generated at the gate lines in odd column, and when the on (1) signals are inputted thereto via the CON2 pad, the off (0) signals are generated at the gate lines in odd column. When the off (0) signals are inputted to the second input terminals of the NOR3 via the CON3 pad, the on (1) signals are generated at the gate lines in even column, and when the on (1) signals are inputted thereto via the CON3 pad, the off (0) signals are generated at the gate lines in even column.

When driving a liquid crystal display later, the off (0) signals are applied to all of CON1, CON2 and CON3 pads. In this way, since the signals applied to the gate lines are determined depending on the signals outputted from the respective stages SRC1–SRC192 of the gate driving circuit 170, the logic circuit 180 for VI is the same as non-existence.

The above logic is represented in table 1.

TABLE 1

|  | CON1 | CON2 | CON3 |
|---|---|---|---|
| Odd lines on | 1 | 0 | 1 |
| Even lines on | 1 | 1 | 0 |
| All lines on | 1 | 0 | 0 |
| All lines off | 1 | 1 | 1 |
| at operation of panel | 0 | 0 | 0 |

Now, a wire of data line for VI will be described.

As shown in FIG. 15, the transmission gate portion 120, which is part of a driving circuit, is formed on the TFT panel, and the input terminals of the transmission gates are all connected to the short strip 111. The source electrodes of the respective TFTs ST2 and ST3 are connected to the short strip 111 as the input terminals of the transmission gates, the drain electrodes thereof are connected to the respective data lines DL1 and DL2 and the gate electrodes thereof are connected to one of two transmission gate terminals TG1 and TG2. In FIG. 15, the TFTs ST2 in the odd number are connected to the TG1 and the TFTs ST3 in the even number are connected to the TG2.

When VI is performed in this structure, image signals are inputted to the short strip 111 via a Vs terminal. The TFTs ST2 and ST3 of the transmission gate portion 120 may be turned either on or off depending on signals inputted to the TG1 and TG2 terminals to provide the image signals to the data lines either in odd number or in even number, or to the data lines in both of them.

A sixth embodiment of the present invention implements 2G capable of discriminately driving gate lines in odd number and gate line in even number using the logic circuit portion 180 for VI and 2D capable of discriminately driving data lines in odd number and data lines in even number using the short strip 111 and the transmission gate portion 120. Thus, it is possible to detect a short among the neighboring data lines DL1–DLn and the neighboring gate lines GL1–GLn.

In FIG. 15, A represents a position where the data driving integrated circuit (IC) is mounted, and B represents a line where a laser is irradiated in order to divide the short strip 111 from the transmission gate portion 120 after completing VI.

When VI is performed under such a configuration as above, the signals inputted from the respective pads are represented in table 2.

TABLE 2

| Number | Name of pads | Voltages applied to the pads |
|---|---|---|
| 1 | Von | Von |
| 2 | Voff | Voff |
| 3 | Vcom | Vcom |
| 4 | CON1 | Von |
| 5 | CON2 | Von or Voff (varied depending on the gate lines either in odd number or in even number intended to be driven) |

TABLE 2-continued

| Name Number of pads | | Voltages applied to the pads |
|---|---|---|
| 6 | CON3 | Von or Voff (varied depending on the gate lines either in odd number or in even number intended to be driven) |
| 7 | Vs | Image signals |
| 8 | TG1 | Von or Voff (varied depending on the gate lines either in odd number or in even number intended to be driven) |
| 9 | TG2 | Von or Voff (varied depending on the gate lines either in odd number or in even number intended to be driven) |

A seventh embodiment of the present invention will be described.

Figure 20:
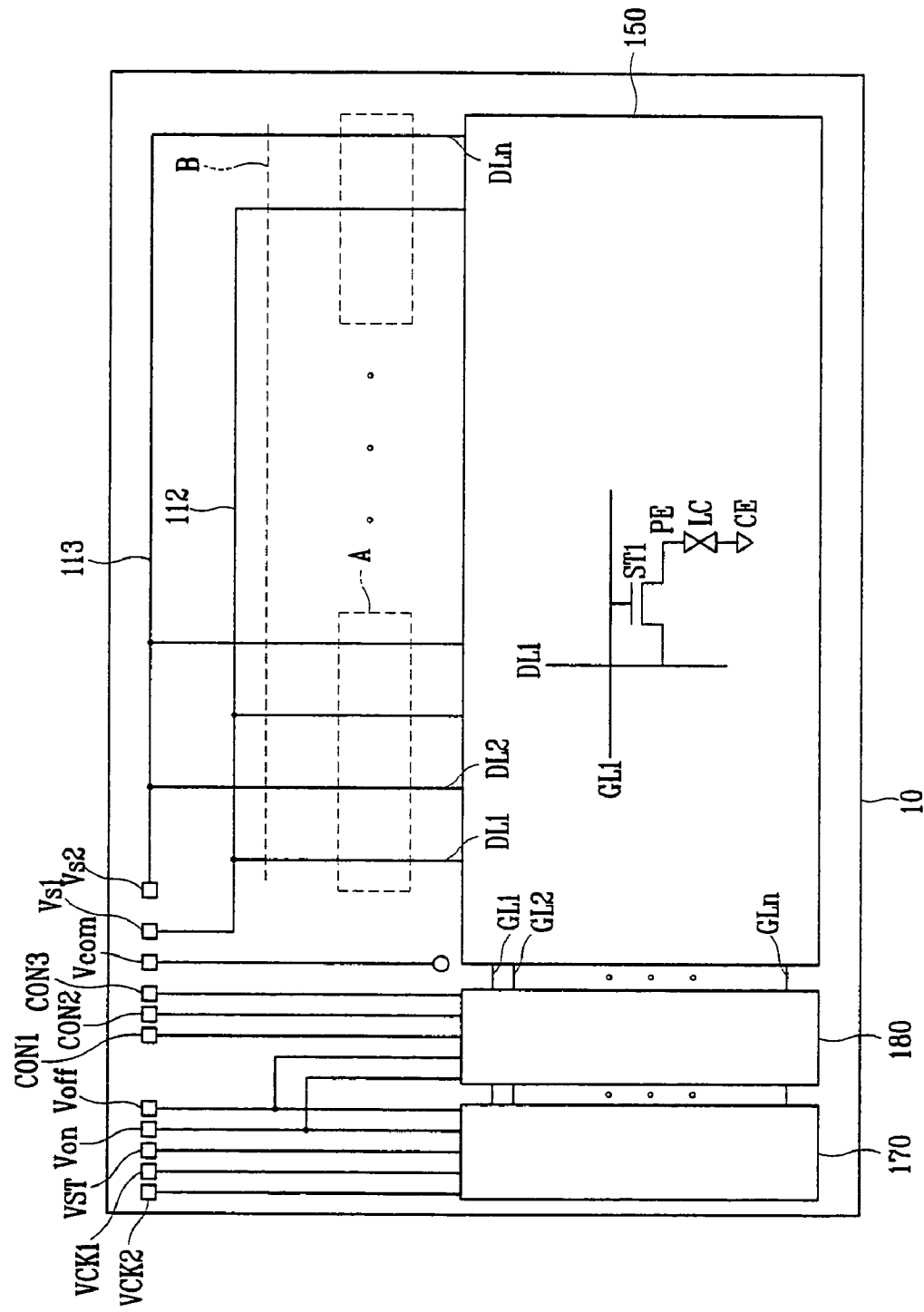
FIG. 20 is a circuitry diagram of a thin film transistor according to a seventh embodiment of the present invention.

FIG. 20 is a circuitry diagram of a TFT according to a seventh embodiment of the present invention.

The seventh embodiment of the present invention is the same as the sixth embodiment except that there is no transmission gate portion and short strips are two. In the seventh embodiment, the data lines in odd number are connected to a first short strip 112 and the data lines in even number are connected to a second short strip 113. Each of the first short strip 112 and the second short strip 114 is connected to Vs1 and Vs2 terminals to form a 2D structure. The seventh embodiment of the present invention is to implement 2G, 2D and VI structures in case of integrating only gate driving circuit on a TFT panel.

When VI is performed under such a configuration as above, the signals inputted from the respective pads are represented in table 3.

TABLE 3

| Name number of pads | | Voltages applied to the pads |
|---|---|---|
| 1 | Von | Von |
| 2 | Voff | Voff |
| 3 | Vcom | Vcom |
| 4 | CON1 | Von |
| 5 | CON2 | Von or Voff (varied depending on the gate lines either in odd number or in even number intended to be driven) |
| 6 | CON3 | Von or Voff (varied depending on the gate lines either in odd number or in even number intended to drive) |
| 7 | Vs1 | Image signals 1 |
| 8 | Vs2 | Image signals 2 |

Figure 21:
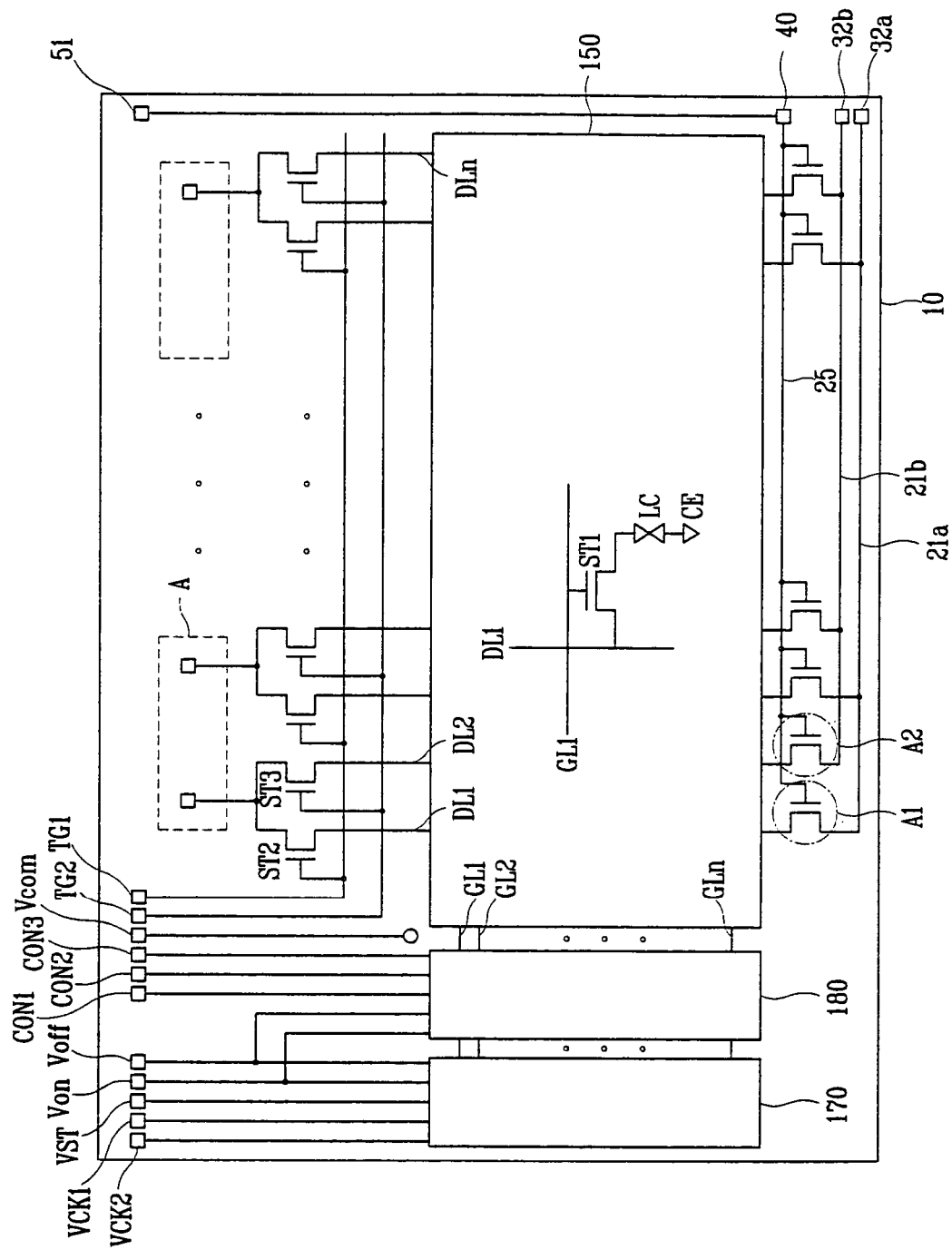
FIG. 21 is a circuitry diagram of a thin film transistor according to a eighth embodiment of the present invention.

FIG. 21 is a circuitry diagram of a TFT panel according to an eighth embodiment of the present invention.

The eighth embodiment of the present invention is the same as the sixth embodiment except that there is no short strip and, in place thereof, first and second data TFTs $A_1$ and $A_2$ for inspection are formed.

As shown in FIG. 21, the first data TFT $A_1$ is connected to a first data inspection signal line 21a and a data driving signal line 25, and a second TFT $A_2$ is connected to a second data inspection signal line 21b and the data driving signal line 25. In addition, the data lines DL1–DLn are connected to drain electrodes of the first and second data TFTs $A_1$ and $A_2$, and the data driving signal line 25 are connected to gate electrodes of the first and second data TFTs $A_1$ and $A_2$. The first data inspection signal 21a is connected to source electrodes of the first data TFT $A_1$, and the second data inspection signal line 21b is connected to source electrodes of the second data TFT $A_2$. First to third pads 32a, 32b and 40 for inspection are connected to one end of each of the first and the second inspection signals 21a and 21b and the data driving signal line 25. In this case, the data driving signal line 25 is connected to the data $V_{off}$ terminal 51. That is, the gate electrodes of the data TFTs $A_1$ and $A_2$ are all connected to the data $V_{off}$ terminal 51. $V_{off}$ terminal 51 is always kept a $V_{off}$ voltage by being connected to $V_{off}$ voltage applying circuit via an FPC in a later module process. Thus, the data TFTs $A_1$ and $A_2$ are in the same state as disconnection since it is always kept in the off state upon driving of a liquid crystal display. Accordingly, a diamond-cutting or a laser-cutting does not need to be performed in order to divide a wire for inspection with a data line and a gate line.

In the meanwhile, since the data lines DL1–DLn are connected to the first data TFT $A_1$ and the second data TFT $A_2$ in turn, it is possible to drive the data lines DL1–DLn in turn by driving the TFTs $A_1$ and $A_2$ separately. Accordingly, it is possible to detect a short among the neighboring data lines DL1–DLn.

When VI is performed under such a configuration as above, the signals inputted from the respective pads are represented in table 4.

TABLE 4

| Name number of pads | | Voltages applied to the pads |
|---|---|---|
| 1 | Von | Von |
| 2 | Voff | Voff |
| 3 | Vcom | Vcom |
| 4 | CON1 | Von |
| 5 | CON2 | Von or Voff (varied depending on the gate lines either in odd number or in even number intended to be driven) |
| 6 | CON3 | Von or Voff (varied depending on the gate lines either in odd number or in even number intended to be driven) |
| 7 | 40 | Von |
| 8 | 32a | Image signals 1 |
| 9 | 32b | Image signals 2 |

In the meanwhile, the structure of omitting the transmission gate circuit is also possible in FIG. 21.

Figure 22:
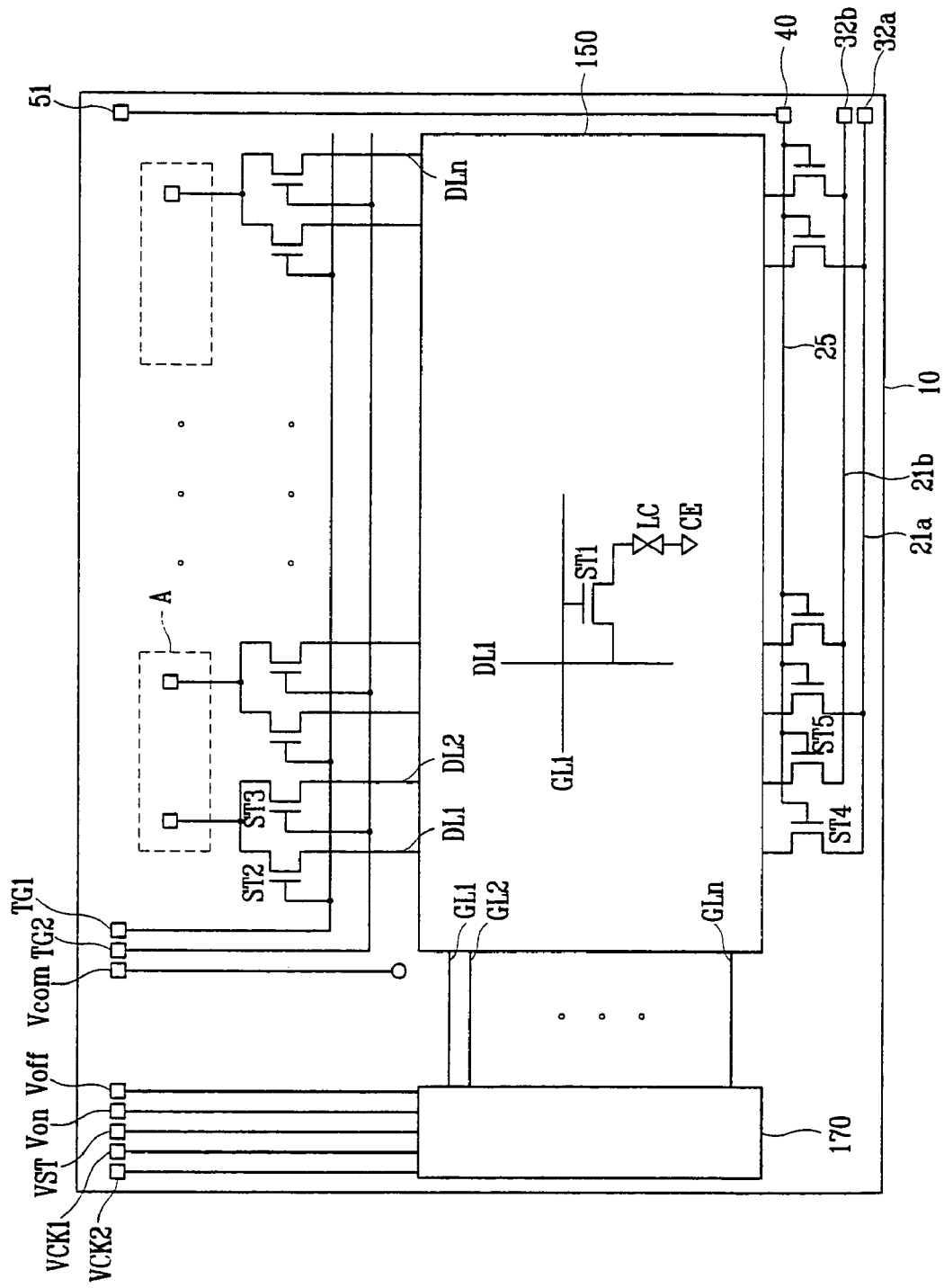
FIG. 22 is a circuitry diagram of a thin film transistor according to a ninth embodiment of the present invention.

FIG. 22 is a circuitry diagram of a TFT panel according to a ninth embodiment of the present invention.

The TFT panel according to the ninth embodiment of the present invention is the same as the eighth embodiment except omitting the logic circuit.

It is possible to perform 1G and 2D VI by applying such voltages as shown in table 5 to respective pads of the TFT having this structure. That is, it is possible to performing VI by getting all the gate lines GL1–GLn to be in the on state and by turning on or off the data lines DL1–DLn in turn.

TABLE 5

| Number | Name of pads | Voltages applied to the pads |
|---|---|---|
| 1 | Von | Von |
| 2 | Voff | Von |
| 3 | Vcom | Vcom |
| 4 | VST | Von |
| 5 | VCK1 | Von |
| 6 | VCK2 | Von |
| 7 | 40 | Von |
| 8 | 32a | Image signals 1 |
| 9 | 32b | Image signals 2 |

Also in the TFT panel according to the ninth embodiment of the present invention, like the eighth embodiment, the $V_{off}$ terminal 51 is always kept $V_{off}$ voltage by being connected to $V_{off}$ voltage applying circuit via an FPC in a later module process. Thus, the data TFTs $A_1$ and $A_2$ are in the same state as disconnection since it is always kept in the off state upon driving of a liquid crystal display. Accordingly, a diamond-cutting or a laser-cutting does not need to be performed in order to divide a wire for inspection with a data line and a gate line.

Figure 23:
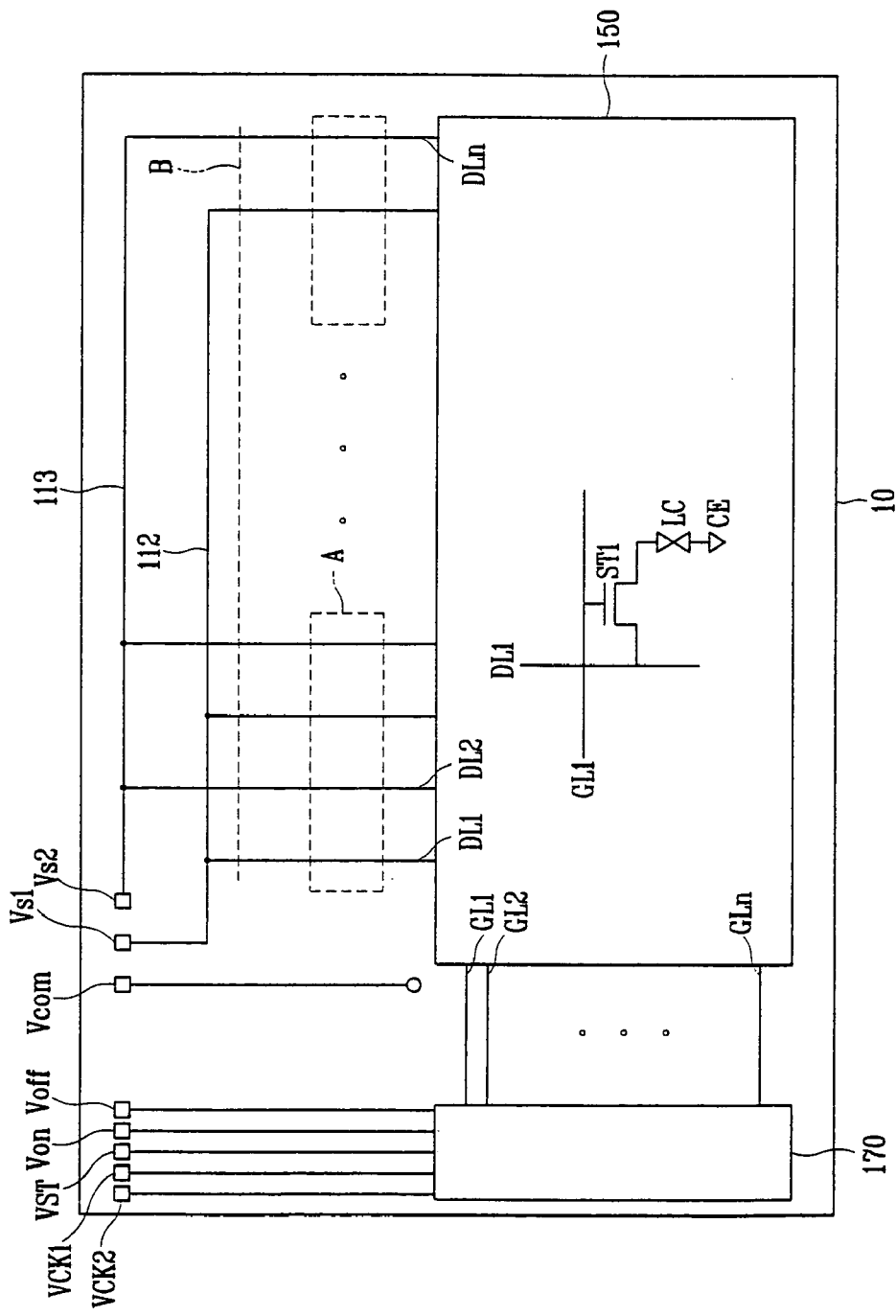
FIG. 23 is a circuitry diagram of a thin film transistor according to a tenth embodiment of the present invention.

FIG. 23 is a circuitry diagram of a TFT panel according to a tenth embodiment of the present invention.

The TFT panel according to the tenth embodiment of the present invention is as the seventh embodiment except omitting the logic circuit portion for VI.

It is possible to implement 1G and 2D VI by applying such voltages as shown table 6 to respective pads of the TFT having this structure. That is, it is possible to forming VI by getting all the gate lines GL1–GLn to be in the on state and by turning or off the data lines DL1–DLn in turn.

The tenth embodiment of the present invention needs to perform a laser-cutting or a diamond-cutting in order to divide the short strips 112 and 113 from the data lines after performing VI.

Aforementioned embodiments are applicable to any kind of forming part of driving IC on a TFT panel directly, such as a polysilicon TFT panel or an amorphous silicon driving IC panel.

TABLE 6

| Number | Name of pads | Voltages applied to pads |
|---|---|---|
| 1 | Von | Von |
| 2 | Voff | Von |
| 3 | Vcom | Vcom |
| 4 | VST | Von |
| 5 | VCK1 | Von |
| 6 | VCK2 | Von |
| 7 | Vs1 | Image signals 1 |
| 8 | Vs2 | Image signals 2 |

Although the present invention has been described with reference to exemplary embodiments, it is not limited to the embodiments disclosed above. The scope of the present invention includes a variety of modification and equivalents that fall within the appended claim.

As described above, an inspection is done by connecting a wire for inspection to data lines and gate lines via a TFT for inspection, and after the inspection, by applying $V_{off}$ voltages to the TFT for inspection, which is kept in the same state as cut without a separate cutting process. Therefore, it is possible to remove additional processes necessary to cut the wire for inspection and to solve the wire-corrosion caused by cutting.

In the meantime, according to the present invention, it is possible to perform 2G and 2D or 1G and 2D visual inspection in the TFT panel where gate driving ICs are integrated.

What is claimed is:

1. A thin film transistor panel comprising:
an insulating substrate having a display area and a surrounding area;
a plurality of gate lines formed on the insulating substrate;
a data driving signal line formed on the surrounding area of the insulating substrate;
a data inspection signal line formed on the surrounding area of the insulating substrate;
a gate insulating layer formed on the gate lines, the data driving signal line and the data inspection signal line;
a first semiconductor pattern formed on the gate insulating layer, at least a portion thereof overlapping the data driving signal lines;
first and second ohmic contact layers formed on the first semiconductor pattern, exposing therebetween a portion of the first semiconductor pattern corresponding to the data driving signal line;
a plurality of data lines formed on the gate insulating layer and intersecting the gate lines to define the display area, at least a portion thereof being formed on the second ohmic contact layer;
a first electrode for inspection formed on the gate insulating layer, at least a portion thereof being formed on the first ohmic contact layer;
a passivation layer formed on the data lines and the first electrode for inspection; and
a first connection portion formed on the passivation layer and connecting the data inspection signal line and the first electrode for inspection.

2. The thin film transistor film of claim 1, further comprising:
a gate driving signal line formed on the surrounding area of the insulating substrate;
a gate inspection signal line formed on the surrounding area of the insulating substrate;
a second semiconductor pattern formed on the gate insulating layer, at least a portion thereof overlapping the gate driving signal line;
third and fourth ohmic contact layers formed on the second semiconductor pattern and exposing therebetween a portion of the second semiconductor pattern corresponding to the gate driving signal line;
a second electrode for inspection formed on the gate insulating layer, at least a portion thereof being formed on the third ohmic contact layer;
a third electrode for inspection formed on the gate insulating layer, at least a portion thereof being formed on the fourth ohmic contact layer;
a second connection portion formed on the passivation layer and connecting the gate line and the third electrode for inspection; and
a third connection portion formed on the passivation layer and connecting the gate inspection signal line and the second electrode for inspection.

3. The thin film transistor panel of claim 2, wherein the first to fourth ohmic contact layers are formed on an entire surface of the data line and the first to third electrodes for inspection, respectively.

4. A thin film transistor panel comprising:
an insulating substrate comprising a display area and a surrounding area;
a plurality of gate lines formed on the insulating substrate;
a plurality of data lines formed on the insulating substrate and intersecting the gate lines to define the display area;
a gate driving circuit formed on the surrounding area and connected to the gate lines; and
a logic circuit for visual inspection (VI) inserted between the gate driving circuit and the gate lines and having a plurality of first to third NOR gates,
wherein a first input terminal of the first NOR gate of the logic circuit for visual inspection is connected to an output terminal of the gate driving circuit and a second input terminal thereof is connected to a CON1 terminal and an output terminal thereof is connected to a first input terminal of the second or the third NOR gate, and a second input terminal of the second NOR gate is connected to a CON2 terminal and an output terminal thereof is connected to the gate lines in odd number, and a second input terminal of the third NOR gate is connected to a CON3 terminal and an output terminal thereof is connected to the gate lines in even number.

5. The thin film transistor panel of claim 4, further comprising:
   a transmission gate circuit formed on the surrounding area, an output terminal thereof being connected to the data lines; and
   a short strip connected to an input terminal of the transmission gate circuit.

6. The thin film transistor panel of claim 4, further comprising:
   a transmission gate circuit formed on the surrounding area of the insulating substrate and having an output connected to the data lines;
   a driving signal line formed on the surrounding area of the insulating substrate and connected to $V_{off}$ voltage applying terminal;
   an inspection signal line formed on the surrounding area of the insulating substrate; and
   a thin film transistor having a drain electrode coupled to the data lines, a source electrode coupled to the inspection signal line and a gate electrode coupled to the driving signal line.

7. The thin film transistor panel of claim 6, wherein the inspection signal line connected to the thin film transistor for inspection comprises first and second inspection signal lines, and the thin film transistor for inspection is alternatingly connected the first inspection signal and the second inspection signal.

8. The thin film transistor panel of claim 4, further comprising:
   a first short strip connected to the data lines in odd number; and
   a second short strip connected the data lines in even number.

9. The thin film transistor panel of claim 4, further comprising:
   a driving signal line formed on the surrounding area of the insulating substrate and connected to the $V_{off}$ voltage applying terminal;
   an inspection signal line formed on the surrounding area of the insulating substrate; and
   a thin film transistor having a drain electrode coupled to the data lines, a source electrode coupled to the inspection signal line and a gate electrode coupled to the driving signal line.

* * * * *

UNITED STATES PATENT AND TRADEMARK OFFICE
CERTIFICATE OF CORRECTION

PATENT NO.       : 7,009,202 B2
APPLICATION NO.  : 10/843270
DATED            : March 7, 2006
INVENTOR(S)      : Yong-Kyu Jang et al.

It is certified that error appears in the above-identified patent and that said Letters Patent is hereby corrected as shown below:

Title Page,
Item (75), Inventors, after "Jang,", delete "Suwon" and insert therefor --Suwon-city--.
Item (75), Inventors, after "Lee,", delete "Sungnam" and insert therefor --Sungnam-city--.
Item (75), Inventors, after "Jeon,", delete "Anyang" and insert therefor --Anyang-city--.

Column 5,
Line 35, after "to", delete "a" and insert therefor --an--.

Column 7,
Lines 36-37, after "having", delete "desirablephysiochemical" and insert therefor --desirable physiochemical--.

Column 9,
Line-60, after "is", delete "large," and insert therefor --large;--.
Line 66, after "wet", delete "etching," and insert therefor --etching;--.

Column 10,
Line 20, after "isolated", insert therefor --from--.

Column 11,
Line 25, after "and", delete "1B" and insert therefor --11B--.

Column 14,
Line 15, after "and", delete "25B," and insert therefor --25B; --.

Column 15,
Line 22, after "phase", insert --from--.

Column 16,
Line 47, after "turn-on", delete "," and insert therefor --;--.

Column 21,
Line 10, after "is", insert therefor --the same--.
Line 13, after "shown", insert --in--.
Line 16, after "turning", insert --on--.

UNITED STATES PATENT AND TRADEMARK OFFICE
CERTIFICATE OF CORRECTION

PATENT NO. : 7,009,202 B2
APPLICATION NO. : 10/843270
DATED : March 7, 2006
INVENTOR(S) : Yong-Kyu Jang et al.

It is certified that error appears in the above-identified patent and that said Letters Patent is hereby corrected as shown below:

Column 24,
Line 5, after "connected", insert --to--.
Line 11, after "connected", insert --to--.

Signed and Sealed this

First Day of May, 2007

JON W. DUDAS
*Director of the United States Patent and Trademark Office*